United States Patent
Kataoka et al.

(10) Patent No.: US 12,175,203 B2
(45) Date of Patent: Dec. 24, 2024

(54) CONTROL METHOD, CONTROL PROGRAM, AND INFORMATION PROCESSING DEVICE

(71) Applicant: FUJITSU LIMITED, Kawasaki (JP)

(72) Inventors: Masahiro Kataoka, Kamakura (JP); Satoshi Onoue, Yokohama (JP); Akira Sakai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 330 days.

(21) Appl. No.: 17/559,516

(22) Filed: Dec. 22, 2021

(65) Prior Publication Data

US 2022/0114347 A1    Apr. 14, 2022

Related U.S. Application Data

(63) Continuation of application No. PCT/JP2019/030379, filed on Aug. 1, 2019.

(51) Int. Cl.
*G06F 40/00*       (2020.01)
*G06F 40/12*       (2020.01)
(Continued)

(52) U.S. Cl.
CPC .............. *G06F 40/40* (2020.01); *G06F 40/12* (2020.01); *G06F 40/242* (2020.01); *G06F 40/247* (2020.01); *G06F 40/268* (2020.01)

(58) Field of Classification Search
CPC ........ G06F 40/40; G06F 40/12; G06F 40/242; G06F 40/247; G06F 40/268; H03M 7/4062

See application file for complete search history.

(56) References Cited

U.S. PATENT DOCUMENTS 5,006,849 A    4/1991  Baarman et al.
2006/0020607 A1  1/2006  Patterson
(Continued)

FOREIGN PATENT DOCUMENTS

CN    105052041        11/2015
CN    109697162 A  *  4/2019  .......... G06F 11/3608
(Continued)

OTHER PUBLICATIONS

"Tang, Zhan-yong, A Software Based On Open Source Code Library Defect Automatic Detecting Method, 2019, PE2E Machine Translation_CN109697162, pp. 1-11" (Year: 2019).*
(Continued)

*Primary Examiner* — Douglas Godbold
*Assistant Examiner* — Parker Mayfield
(74) *Attorney, Agent, or Firm* — Fujitsu Intellectual Property Center

(57) ABSTRACT

A computer: acquires, from a compression dictionary that associates each of codes having a length according to a frequency of appearance of a set of a word and a word meaning of the word with that set, the set of any word and that word meaning, and one of the codes associated with the set of the any word and that word meaning; selects, from among a plurality of fixed-length codes stored in the memory with a same length in association with the set of the word and that word meaning, one of the fixed-length codes associated with the set of the any word and that word meaning; generates a conversion dictionary that associates the selected one of the fixed-length codes with the acquired one of the codes; and specifies, by the conversion dictionary, the individual fixed-length codes associated with each of the codes contained in compressed data.

9 Claims, 26 Drawing Sheets

(51) Int. Cl.
  *G06F 40/242* (2020.01)
  *G06F 40/247* (2020.01)
  *G06F 40/268* (2020.01)
  *G06F 40/40* (2020.01)

(56) References Cited

U.S. PATENT DOCUMENTS

| | | | |
|---|---|---|---|
| 2017/0161362 A1 | 6/2017 | Bradbury et al. | |
| 2018/0336178 A1 | 11/2018 | Kataoka et al. | |
| 2019/0130022 A1 | 5/2019 | Kataoka et al. | |
| 2020/0184006 A1* | 6/2020 | Eifert | G16B 50/00 |
| 2020/0185057 A1* | 6/2020 | Leake | B82Y 10/00 |
| 2020/0348990 A1* | 11/2020 | Katzenberger | G06F 16/24568 |

FOREIGN PATENT DOCUMENTS

| | | | | |
|---|---|---|---|---|
| EP | 2978134 A1 * | 1/2016 | | G06F 17/2735 |
| JP | 2006-048685 A | 2/2006 | | |
| JP | 2018-068752 A | 5/2018 | | |
| JP | 2018-195028 A | 12/2018 | | |
| JP | 2019-012468 A | 1/2019 | | |
| JP | 2019-083477 A | 5/2019 | | |
| WO | 2019/003516 A1 | 1/2019 | | |

OTHER PUBLICATIONS

Zamora Martínez, FJ .; Castro-Bleda, MJ. (2018). Efficient Embedded Decoding of Neural Network Language Models in a Machine Translation System. International Journal of Neural Systems. 28(9). https://doi.org/10.1142/S0129065718500077 (Year: 2018).*
Australian Office Action dated Dec. 13, 2022 for corresponding Patent Application No. 2019459693, 3 pages.
Piotr Bojanowski et al., "Enriching Word Vectors with Subword Information", arXiv preprint, arXiv:1607.04606v1 [cs.CL], Jul. 15, 2016 (Total 7 pages).
Armand Joulin et al., "Bag of Tricks for Efficient Text Classification", arXiv preprint, arXiv:1607.01759v3 [cs.CL], Aug. 9, 2016 (Total 5 pages).
International Search Report and Written Opinion of the International Searching Authority (Form PCT/ISA/210, 220, and 237), mailed in connection with PCT/JP2019/030379 and mailed May 9, 2018 (Total 8 pages).
Extended European Search Report dated Jul. 18, 2022 for corresponding European Patent Application No. 19940002.9, 8 pages.
CNOA—Office Action of Chinese Patent Application No. 201980098343.7 mailed on Aug. 26, 2024 with full English translation [16 pages].

* cited by examiner

FIG. 3A

◇ WORD SHIFT SIDE (HIGH-FREQUENCY WORD)

| | 0*h | 1*h | 2*h | 3*h | 4*h | 5*h | 6*h | 7***h |
|---|---|---|---|---|---|---|---|---|
| *0h | NUL | DLE | SP(△) | for | 、 | な | 0 | HIGH-FREQUENCY WORD (ENGLISH WORD) |
| *1h | SOH | DC1 | ,(COMMA) | with | 。 | ない | 1 | |
| *2h | STX | DC2 | .(PERIOD) | me | 「 | だ | 2 | |
| *3h | ETX | DC3 | '(QUOTATION MARK) | it | 」 | から | 3 | |
| *4h | EOT | DC4 | UPPERCASE (EACH WORD) | be | の | ある | 5 | |
| *5h | ENQ | NAK | UPPERCASE (ALL LETTERS) | this | に | か | 10 | |
| *6h | ACK | SYN | | your | で | こと | 20 | |
| *7h | BEL | ETB | the | his | は | その | 50 | |
| *8h | BS | CAN | and | he | た | く | 100 | |
| *9h | HT | EM | to | but | を | い | 500 | |
| *Ah | LF/NL | SUB/EOF | of | as | が | う | 1000 | |
| *Bh | VT | ESC | you | have | と | いる | 10000 | |
| *Ch | FF/NP | FS | my | so | で | もの | NUL COLUMN | |
| *Dh | CR | GS | that | him | も | 人 | 2NUL COLUMN | |
| *Eh | SO | RS | in | will | し | れ | 4NUL COLUMN | |
| *Fh | SI | US | is | | | あの | 8NUL COLUMN | |
| | not | | | | | | | |
| | DEL(-△) | | | | | | | |
| | CONTROL CODE (COMMON) 1 BYTE | | ULTRA-HIGH FREQUENCY WORD (ENGLISH) 1BYTE (32 WORDS) | | ULTRA-HIGH FREQUENCY WORD (JAPANESE) 1BYTE (32 WORDS) | | ULTRA-HIGH FREQUENCY WORD (NUMERICAL VALUE) 1BYTE (16 WORDS) | HIGH-FREQUENCY WORD (ENGLISH) 2 BYTES (4K WORDS) 2 BYTES |

FIG. 3B

◇ WORD SHIFT SIDE (HIGH-FREQUENCY WORD)

| | 8*h | 9*h | A*h | B*h | C*h | D*h | E*h | F***h |
|---|---|---|---|---|---|---|---|---|
| *0h | HIGH-FREQUENCY WORD (JAPANESE) | HIGH-FREQUENCY WORD (NUMERICAL VALUE) | LOW-FREQUENCY WORD (DYNAMIC CODE) 2 BYTES | LOW-FREQUENCY WORD (DYNAMIC CODE) | LOW-FREQUENCY WORD (DYNAMIC CODE) | LOW-FREQUENCY WORD (DYNAMIC CODE) | LOW-FREQUENCY WORD (DYNAMIC CODE) | LOW-FREQUENCY WORD (DYNAMIC CODE) |
| *1h | | | | | | | | |
| *2h | | | | | | | | |
| *3h | | HIGH-FREQUENCY WORD (THIRD LANGUAGE) | | | | | | |
| *4h | | | | | | | | |
| *5h | | | | | | | | |
| *6h | | | | | | | | |
| *7h | | | | | | | | |
| *8h | | | | | | | | |
| *9h | | | | | | | | |
| *Ah | | | | | | | | |
| *Bh | | | | | | | | |
| *Ch | | | | | | | | |
| *Dh | | | | | | | | |
| *Eh | | | | | | | | |
| *Fh | 2 BYTES | 2 BYTES | 2 BYTES | 2 BYTES | 2 BYTES | 2 BYTES | 2 BYTES | 3 BYTES |

HIGH-FREQUENCY WORD (JAPANESE) 2 BYTES (4K WORDS)

HIGH-FREQUENCY WORD (NUMERICAL VALUE, THIRD LANGUAGE) 2 BYTES (4K WORDS)

LOW-FREQUENCY WORD (DYNAMIC CODE) 2 BYTES (4K WORDS)

LOW-FREQUENCY WORD (DYNAMIC CODE) 2 BYTES (4K WORDS)

LOW-FREQUENCY WORD (DYNAMIC CODE) 2 BYTES (4K WORDS)

LOW-FREQUENCY WORD (DYNAMIC CODE) 2 BYTES (4K WORDS)

LOW-FREQUENCY WORD (DYNAMIC CODE) 2 BYTES (4K WORDS)

LOW-FREQUENCY WORD (DYNAMIC CODE) 3 BYTES (1M WORDS)

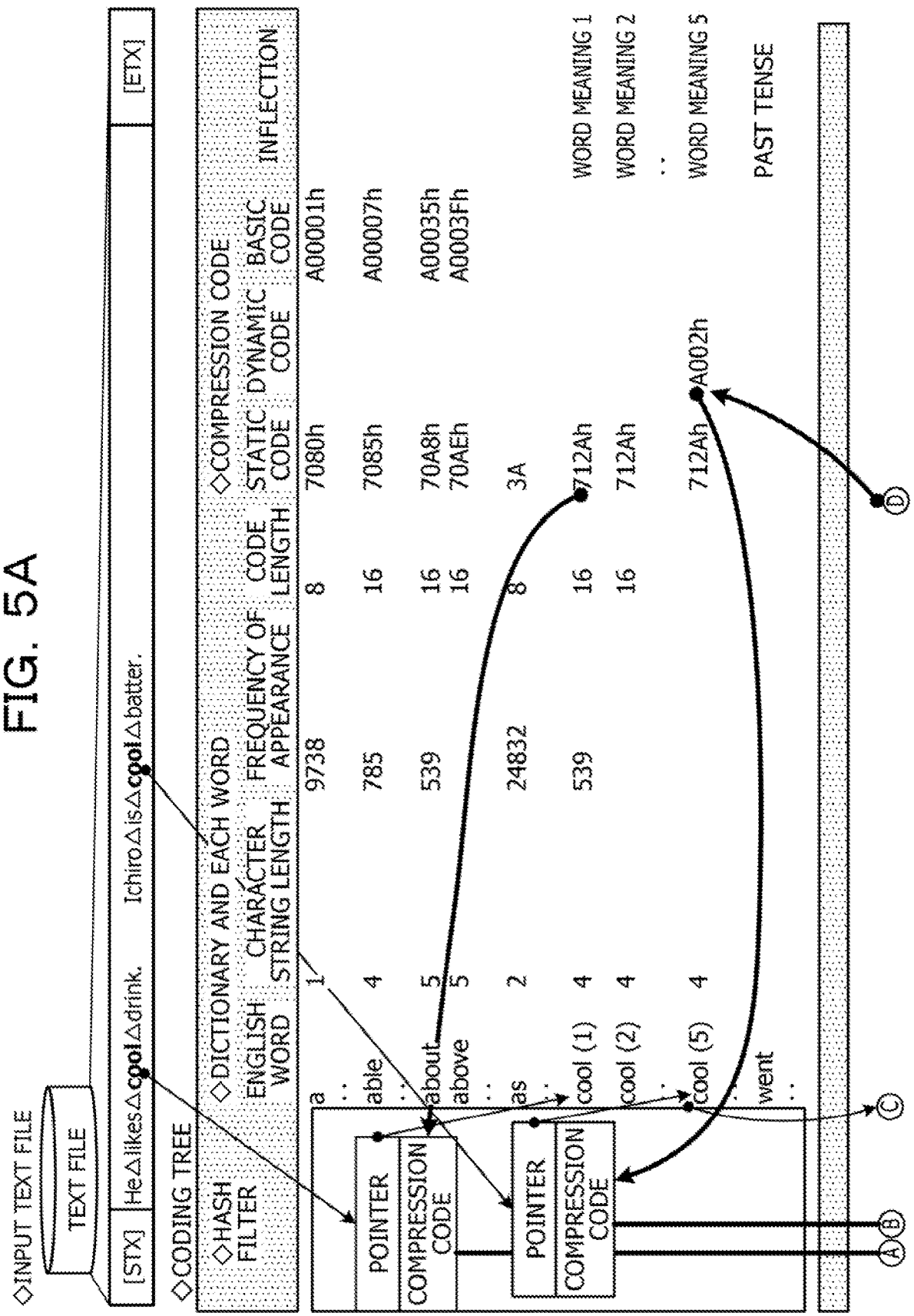

◇EXAMPLE OF BASE SEQUENCE OF GENOME (1) LONGEST MATCHING CHARACTER STRING

|CUG|A|CUG|AU

CUG   CUG

SPLIT (2) CODING IN UNITS OF CODONS

CUG(53h)
    ACU(64h)
        GAU(78h)

CONTROL METHOD, CONTROL PROGRAM, AND INFORMATION PROCESSING DEVICE

CROSS-REFERENCE TO RELATED APPLICATION

This application is a continuation application of International Application PCT/JP2019/030379 filed on Aug. 1, 2019 and designated the U.S., the entire contents of which are incorporated herein by reference.

FIELD

The present invention relates to a control method, a control program, and an information processing device.

BACKGROUND

In recent years, translation techniques utilizing a neural network have been used. Specifically, input text is coded, morphological analysis is performed to divide the text into words in meaningful units, and a vector of each word is generated using a continuous bag-of-words (CBOW) model or the like. Then, using a neural network such as a recurrent neural network (RNN), a brute-force calculation of the vectors of the respective words is executed, and translation is executed based on the calculation result.

Examples of the related art include as follows: Japanese Laid-open Patent Publication No. 2006-048685; Japanese Laid-open Patent Publication No. 2018-068752; Piotr Bojanowski, Edouard Grave, Armand Joulin, and Tomas Mikolovr, "*Enriching Word Vectors with Subword Information*", arXiv preprint arXiv: 1607.04606, 2016; and Armand Joulin, Edouard Grave, Piotr Bojanowski, and Tomas Mikolov, "*Bag of Tricks for Efficient Text Classification*", arXiv preprint arXiv: 1607.01759, 2016.

SUMMARY

According to an aspect of the embodiments, there is provided a computer-implemented method of control, the method comprising: acquiring a compression dictionary stored in a memory device, the compression dictionary being information that associates each of codes having a length according to a frequency of appearance of a set of a word and a word meaning of the word, with the set of the word and the word meaning; acquiring, from the compression dictionary, the set of any word and the word meaning of the any word, and one of the codes associated with the set of the any word and the word meaning of the any word; by referring to the memory device that stores each of a plurality of fixed-length codes with a same length in association with the set of the word and the word meaning, selecting, from among the plurality of fixed-length codes, one of the fixed-length codes associated with the set of the any word and the word meaning of the any word that has been acquired; generating a conversion dictionary that associates the selected one of the fixed-length codes with the acquired one of the codes; and specifying, based on the conversion dictionary, the individual fixed-length codes associated with each of the codes contained in compressed data in which text data is coded.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 3A and 3B illustrate a diagram explaining a static dictionary and a dynamic dictionary;

FIGS. 5A and 5B illustrate a diagram explaining static coding and dynamic coding of a polysemous word;

DESCRIPTION OF EMBODIMENTS

Incidentally, in the above technique, higher speed is implemented by sharing processing by a central processing unit (CPU) and a graphics processing unit (GPU), but vector conversion to handle idioms and inflections of each word is repeatedly executed, and as a result, the processing speed deteriorates.

For example, the processing is shared in such a manner that the CPU executes processing up to the vector generation, and the GPU executes processing to acquire the vectors and execute the calculation. However, when text compressed by ZIP (registered trademark) is decompressed and the text subjected to lexical analysis (morphological analysis) contains many idioms and inflections, vector conversion different from the vector conversion for the word in the basic form occurs frequently, and accordingly, the time taken by the GPU to acquire the vectors from the CPU results in a longer time, which causes deterioration in processing speed. Meanwhile, there is also a disadvantage that the optimization and speeding up of vector allocation for polysemous words such as "cool" and phrases constituted by stop words, such as "take out", still remain.

In one aspect, it is an object to provide a control method, a control program, and an information processing device capable of improving the processing speed and accuracy of vector generation and machine learning.

Hereinafter, embodiments of a control method, a control program, and an information processing device according to the present invention will be described in detail with reference to the drawings. Note that these embodiments do not limit the present invention. Furthermore, each of the embodiments may be appropriately combined within a range without inconsistency.

First Embodiment

[Description of Information Processing Device 10]

Figure 1:
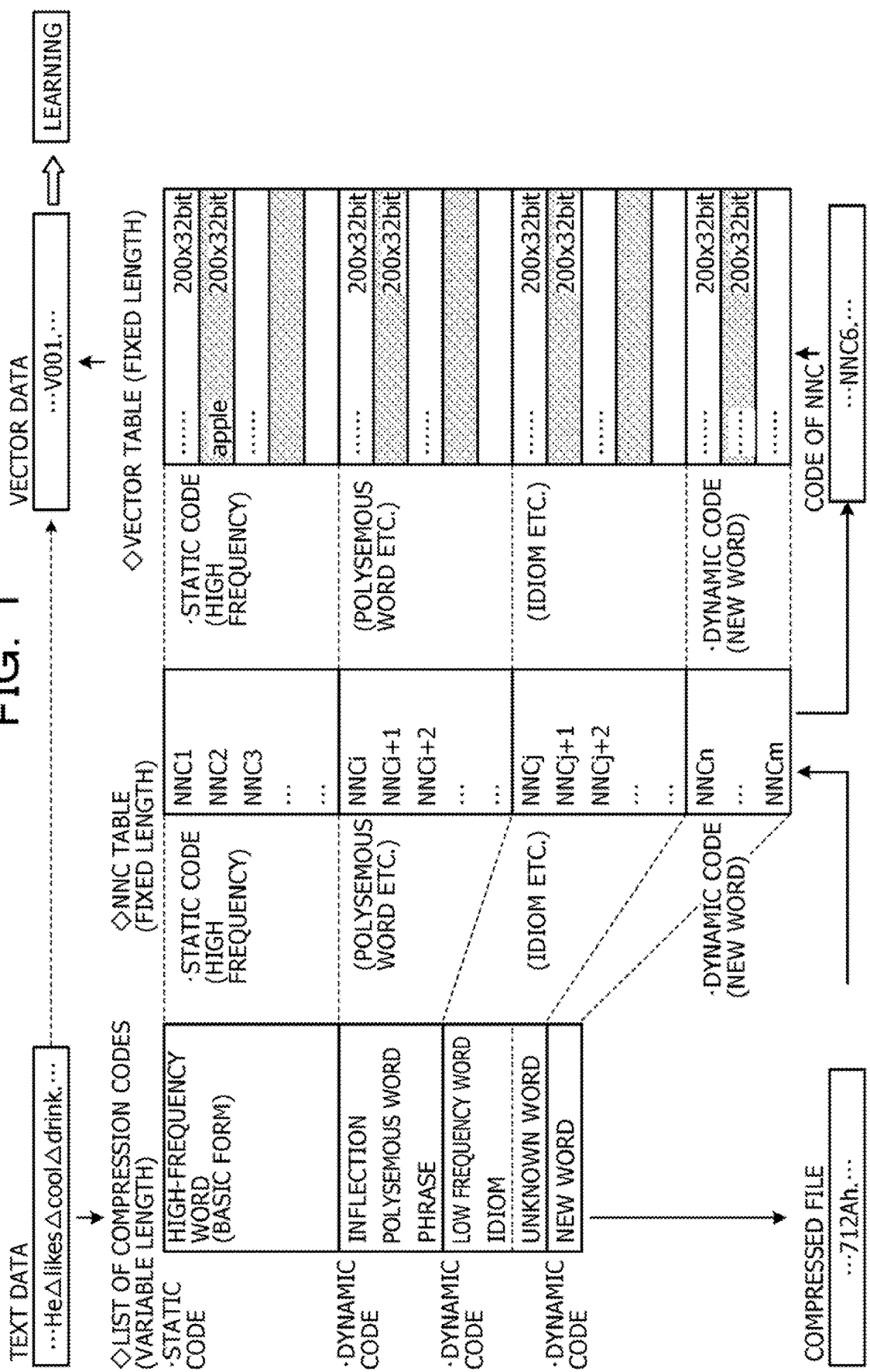
FIG. 1 is a diagram explaining an information processing device according to a first embodiment.

FIG. 1 is a diagram explaining an information processing device 10 according to a first embodiment. As illustrated in FIG. 1, the information processing device 10 is an example of a computer of a machine learning model that predicts a translation result from text data. For example, the information processing device 10 generates a feature amount with English text data in which "translation into Japanese text" is set as an objective variable, as learning data and performs machine translation using a machine learning model on the basis of the generated feature amount.

Here, the information processing device 10 associates a list of compression codes allocated to each word contained in the text data with a neural network code (NNC) table and a vector table.

The list of compression codes has variable-length information including a static code, which is a compression code that is statically set for a high-frequency word that has a high frequency of appearance, and a dynamic code, which is a compression code that has a low frequency of appearance and is dynamically allocated in the order of appearance. For example, the static code is a code that is pre-allocated to the basic form of a word such as go or take, and the dynamic code is a code that is allocated to an inflection of a word, such as goes or takes, a polysemous word such as cool, or a phrase such as take off.

The NNC table is a list of codes set with a fixed length (for example, 32 bits (four bytes)) that can be read out at high speed by the graphics processing unit (GPU) in order to enhance the efficiency of calculation processing. The vector table has information including each vector value of vector data that is used as input data at the time of learning of the machine learning model. In addition, the vector data has a 200-dimensional vector value associated with each NNC.

In such a state, when the text data, which is the learning data, is input, the information processing device 10 allocates the static code or the dynamic code to each word in the text data in accordance with the list of compression codes and generates a compressed file. Subsequently, the information processing device 10 converts each compression code in the compressed file into the NNC based on the correspondence between the list of compression codes and the NNC table and then converts each NNC into the vector value in accordance with the correspondence between the NNC table and the vector table.

In this manner, the information processing device 10 converts the text data into the vector values to execute learning of the machine learning model. Therefore, the information processing device 10 may reduce the reading, decompression, morphological analysis, address calculation by a hash function, and the like for the compression code, which are repeated when a general compressed file is used, and may achieve a significant speedup, while improving the processing speed.

[Functional Configuration]

Figure 2:
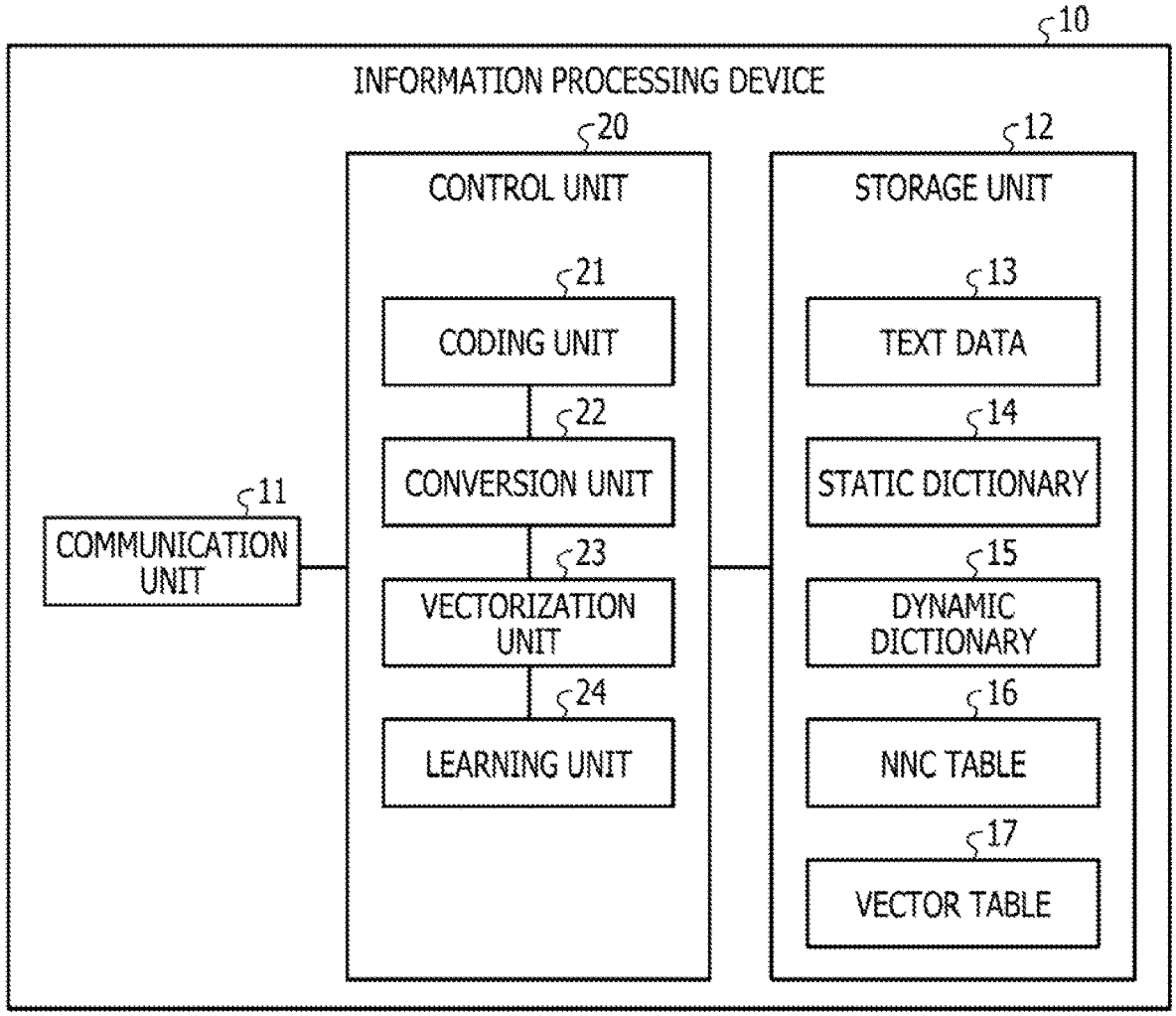
FIG. 2 is a functional block diagram illustrating a functional configuration of the information processing device according to the first embodiment.

FIG. 2 is a functional block diagram illustrating a functional configuration of the information processing device 10 according to the first embodiment. As illustrated in FIG. 2, the information processing device 10 includes a communication unit 11, a storage unit 12, and a control unit 20.

The communication unit 11 is a processing unit that controls communication with another device and, for example, is a communication interface or the like. For example, the communication unit 11 receives instructions to start and end learning, learning data, data to be predicted, and the like from a user terminal of an administrator or the like and transmits the learning result, the prediction result, and the like to the user terminal.

The storage unit 12 is an example of a storage device that stores various sorts of data and a program executed by the control unit 20, or the like and, for example, is a memory, a hard disk, or the like. This storage unit 12 stores text data 13, a static dictionary 14, a dynamic dictionary 15, an NNC table 16, and a vector table 17.

The text data 13 is learning data used for learning of a translation model. For example, the text data 13 is English text data in which "translation into Japanese text" is set as an objective variable.

The static dictionary 14 is a database or the like that stores an association between a word with a high frequency of appearance and a compression code pre-allocated to the word. The dynamic dictionary 15 is a database that stores an association between a word with a low frequency of appearance that is not registered in the static dictionary 14 but is present in the text data to be coded, and a compression code allocated to the word. Note that a buffer unit (not illustrated) or the like may be used to manage a correspondence between a code allocated to the dynamic dictionary 15 and the word meaning of the word for a word such as a polysemous word and a phrase, and for example, the technique of Japanese Laid-open Patent Publication No. 2019-12468 or the like may be adopted.

FIG. 3 (i.e., FIGS. 3A and 3B) is a diagram explaining the static dictionary 14 and the dynamic dictionary 15. The dictionary illustrated in FIG. 3 is a dictionary in which the static dictionary 14 and the dynamic dictionary 15 are merged, where the compression code and the Y-axis as a bitmap type inverted index are associated with each other on a one-to-one basis. On the horizontal axis illustrated in FIG. 3, "0*h" to "6*h" and "7*h" to "9*h" correspond to the static dictionary 14, and "A*h", "E*h", and "F*****h" correspond to the dynamic dictionary 15.

In the items in the horizontal direction in the upper part of FIG. 3, the first hexadecimal number is expressed in hexadecimal from 0 to F, and "*" indicates the subsequent hexadecimal number. For example, the item "1*h" indicates that it is from "10h" to "1Fh". The item "7*h" indicates "7000h" to "7FFFh" in hexadecimal notation. The item "F***h" indicates "F00000h" to "FFFFFFh" in hexadecimal notation.

The codes of "0*h" and "6*h" are 1-byte codes. The codes of "0*h" and "1*h" are associated with common control codes. In addition, the codes of "2*h" to "3*h" are associated with English ultra-high frequency words, the codes of "4*h" to "5*h" are associated with Japanese ultra-high frequency words, and the codes of "6*h" are associated with numerical ultra-high frequency words in advance, which have particularly high frequencies among words that appear frequently.

Furthermore, the codes of "7*h" to "E*h" are 2-byte codes. The codes of "7*h" are associated with English words that appear frequently, the codes of "8*h" are associated with Japanese words that appear frequently, and the codes of "9*h" are associated with numerical values or words of a third language that appear frequently in advance. For the codes of "A*h" to "E*h", codes are dynamically allocated when low-frequency words appear. Note that the item "F***h" is assumed as a 3-byte code to deal with the lack of codes.

The NNC table 16 has information that associates the variable-length compression code of one, two, or three bytes with the fixed-length NNC with the same length of four bytes (32 bits). For example, the NNC table 16 statically associates the static code stored in the static dictionary 14 with the NNC. In addition, for a word newly registered in the dynamic dictionary 15, the NNC table 16 newly associates the NNC with the dynamic code assigned to the word. Note that, by generating a static conversion table or the like in advance for the association between each static code and the NNC, the static association can be managed.

The vector table 17 has information that associates the NNC, which is a fixed-length code, with a 200-dimensional vector value of vector data. For example, the vector table 17 associates the NNC with the vector data on a one-to-one basis in order to generate vectors for model learning. With this vector table 17, it is possible to specify vector data with which the machine learning is to be performed, from among the NNCs corresponding to the words in the text data.

Figure 4:
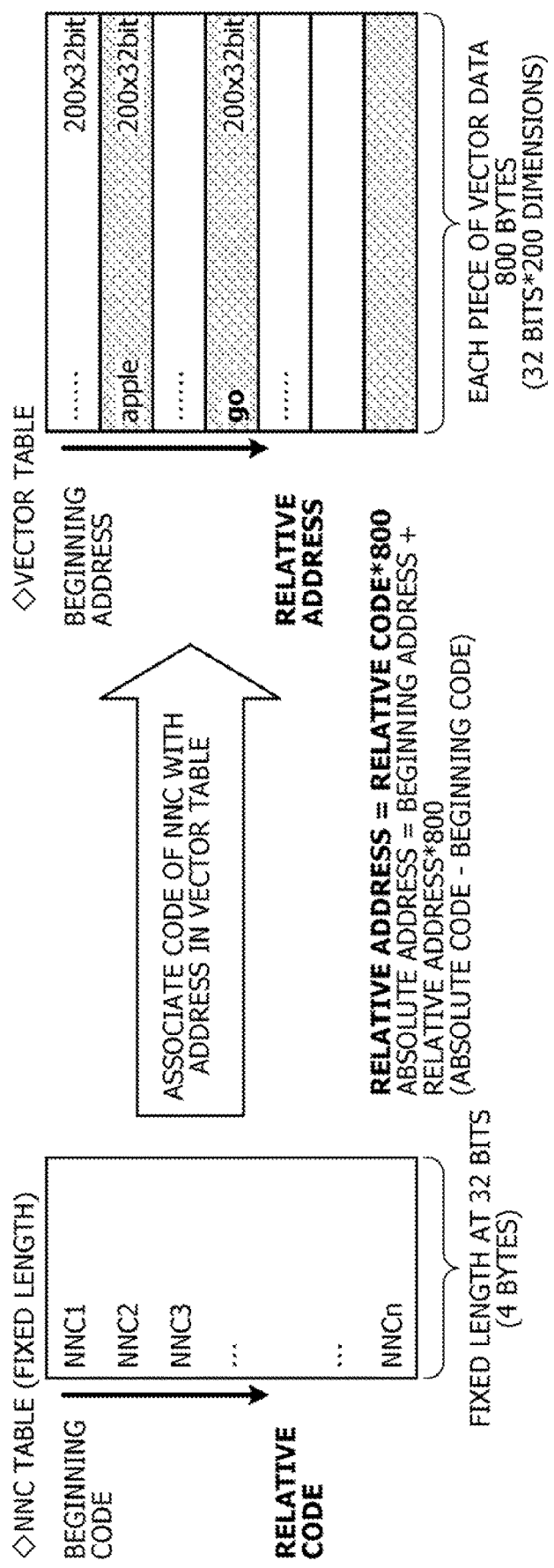
FIG. 4 is a diagram explaining an association between a neural network code (NNC) and vector data.

FIG. 4 is a diagram explaining an association between the NNC and the vector data. As illustrated in FIG. 4, the NNC and the vector data can be associated with each other by a relative address or an absolute address using the beginning code of the NNC table 16 and the beginning address of the vector table 17. For example, in the case of the relative address, the position in the vector table 17 is specified and associated by the relative code of the NNC×800 bytes. In addition, in the case of the absolute address, the position in the vector table 17 is specified and associated by the beginning address + the relative address or the absolute code − the beginning code of the vector table 17.

The control unit 20 is a processing unit that is in charge of the entire information processing device 10 and, for example, is a processor or the like. For example, the control unit 20 includes a coding unit 21, a conversion unit 22, a vectorization unit 23, and a learning unit 24. Note that the coding unit 21, the conversion unit 22, the vectorization unit 23, and the learning unit 24 are examples of electronic circuits included in the processor or examples of processes executed by the processor.

The coding unit 21 is a processing unit that codes the text data 13. Specifically, the coding unit 21 divides the text data 13 into words using an approach such as morphological analysis and codes each word. For example, when the word has been registered in the static dictionary 14, the coding unit 21 converts the word into a relevant static code set in the static dictionary 14.

In addition, when the word has not been registered in the static dictionary 14, the coding unit 21 determines whether or not the word is registered in the dynamic dictionary 15 by referring to the dynamic dictionary 15. Then, when the word is already registered in the dynamic dictionary 15, the coding unit 21 converts the word into a relevant dynamic code set in the dynamic dictionary 15. On the other hand, when the word is not already registered in the dynamic dictionary 15, the coding unit 21 newly registers the word in the dynamic dictionary 15 to allocate a dynamic code and then converts the word into the dynamic code.

Figure 5B:
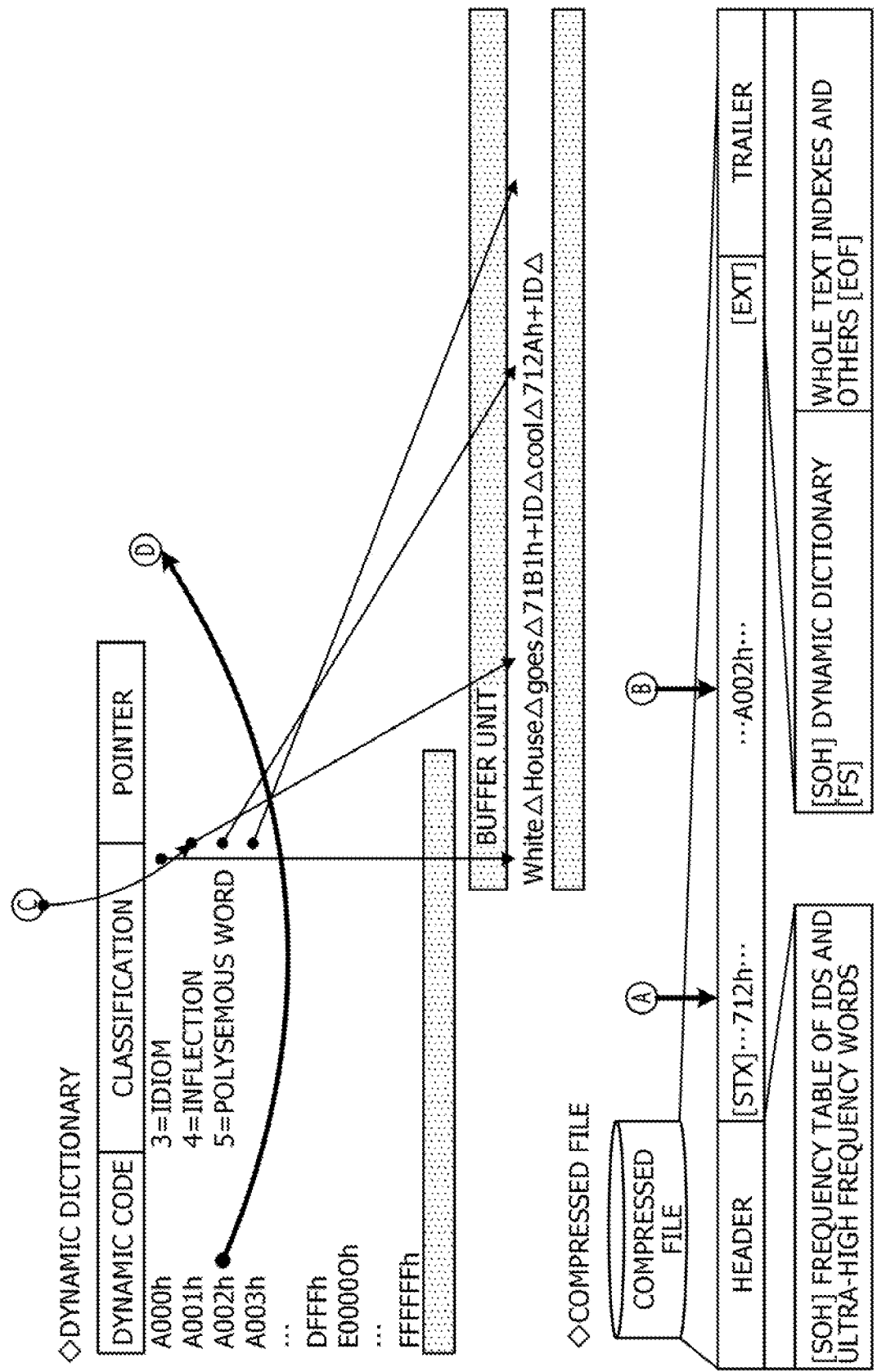

FIG. 5 (i.e., FIGS. 5A and 5B) is a diagram explaining static coding and dynamic coding of a polysemous word. Here, the polysemous word "cool" will be described as an example. As illustrated in FIG. 5, the coding unit 21 identifies the word "cool" used in the meaning of "cold", as "cool (1)" as a basic form. Then, since the static code "712Ah" is allocated to the word "cool" corresponding to "cool (1)" in the static dictionary 14, the coding unit 21 stores a pointer to "cool" and the static code "712Ah" of "cool" in association with each other in a hash filter.

In addition, the coding unit 21 identifies the word "cool" used in the meaning of "smart" as "cool (5)" and allocates a dynamic code because "cool (5)" is not registered in the static dictionary 14. Specifically, the coding unit 21 allocates the dynamic code "A002h" to the word "cool" corresponding to "cool (5)" and registers the dynamic code "A002h" in the dynamic dictionary 15 together with the classification (5=polysemous word). Then, the coding unit 21 stores a pointer to "cool" corresponding to "cool (5)" and the dynamic code "A002h" in association with each other in the hash filter. Furthermore, the coding unit 21 manages the static code "712Ah" and 5, which is the ID, of "cool (5)" allocated with the dynamic code "A002h" in association with each other in a buffer unit of the dynamic dictionary 15 in order to decode the code in the meaning of "cool (5)" when decoding the code. That is, the buffer unit stores information that can specify a set of the word (cool) and the word meaning (smart).

In this manner, the coding unit 21 may allocate the static code or the dynamic code for each meaning of "cool", which is a polysemous word, and may distinguish between the meanings to code. Note that what meaning the polysemous word has when used can be designated by the user and can also be specified automatically by managing the relation between the preceding word and the subsequent word for each meaning.

Figure 6A:
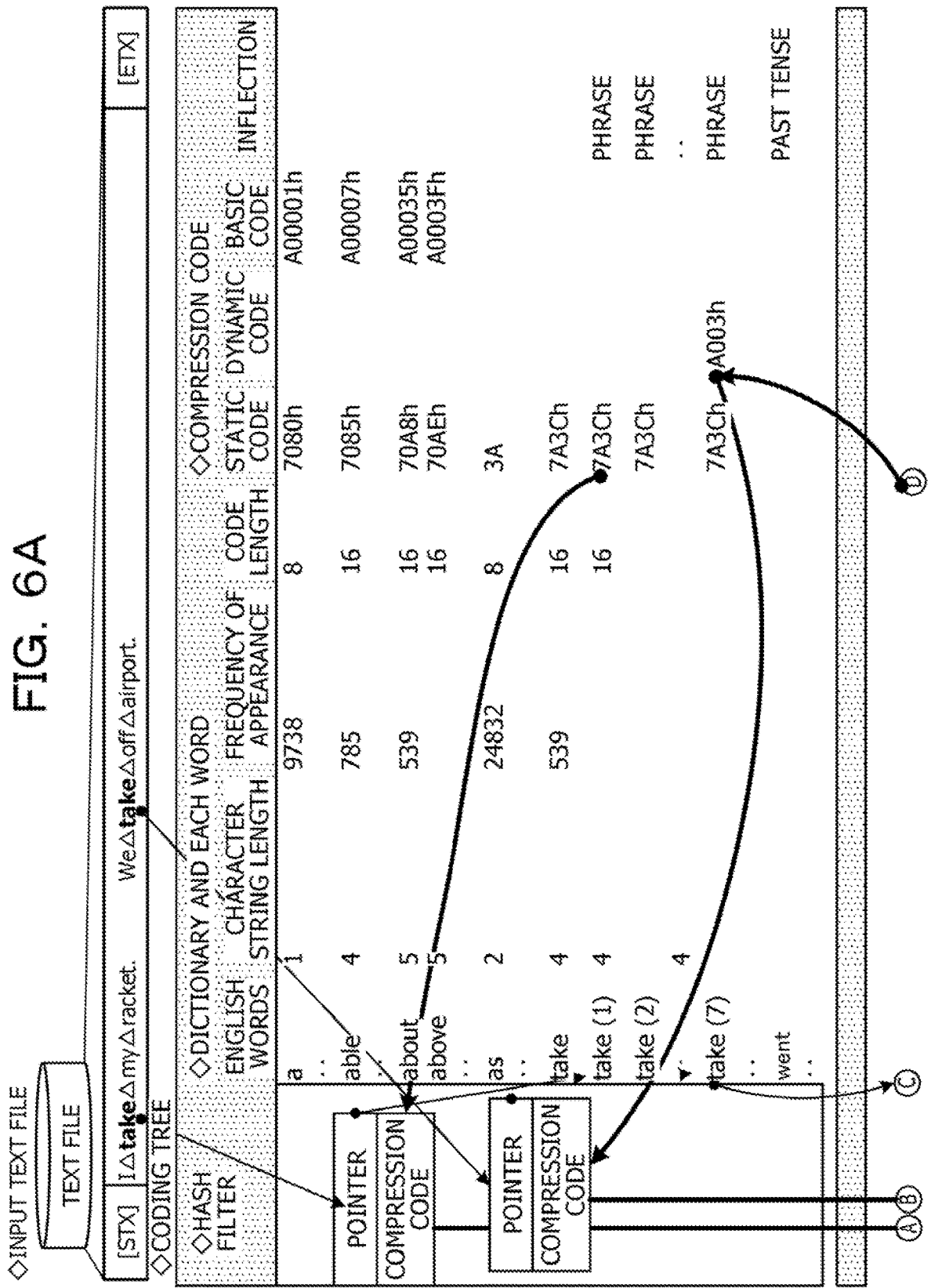
FIGS. 6A and 6B illustrate a diagram explaining static coding and dynamic coding of a phrase.
Figure 6B:
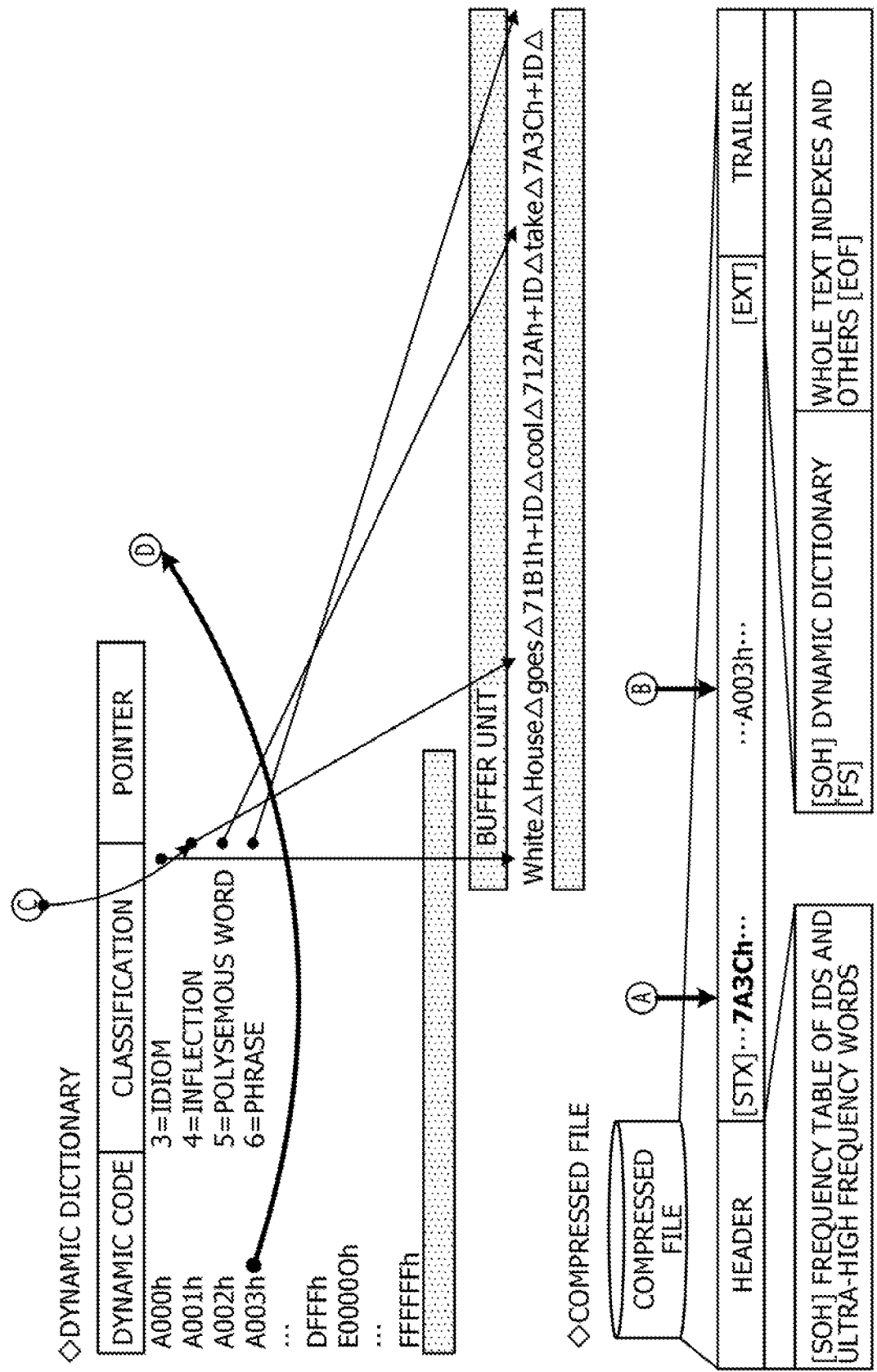

In addition, FIG. 6 (i.e., FIGS. 6A and 6B) is a diagram explaining static coding and dynamic coding of a phrase. Here, "take" used for "take off" and the like will be described as an example. As illustrated in FIG. 6, the coding unit 21 identifies the word "take" as "take (1)" as the basic form. Then, since the static code "7A3Ch" is allocated to the word "take" corresponding to "take (1)" in the static dictionary 14, the coding unit 21 stores a pointer to "take" and the static code "7A3Ch" of "take" in association with each other in the hash filter. Note that, in FIG. 6, the same static code is allocated to a plurality of instances of "take" in order to code the "take" having a plurality of meanings with the same code.

Furthermore, the coding unit 21 identifies the word "take" used as "take off" by being coupled with "off" by "take (7)" and, since "take (7)" is not registered in the static dictionary 14, allocates a dynamic code to "take (7)". Specifically, the coding unit 21 allocates the dynamic code "A003h" to the word "take" corresponding to "take (7)" and registers the dynamic code "A003h" in the dynamic dictionary 15 together with the classification (6=phrase). Then, the coding unit 21 stores a pointer to the word "take" corresponding to "take (7)" and the dynamic code "A003h" in association with each other in the hash filter. Furthermore, the coding unit 21 manages the static code "7A3Ch" and 7, which is the ID, of "take" allocated with the dynamic code "A003h" in association with each other in the buffer unit of the dynamic dictionary 15 in order to decode the code in the meaning of "take (7)" when decoding the code.

In this manner, the coding unit 21 may allocate the static code or the dynamic code for each meaning of "take", which forms a phrase, and may distinguish between the meanings to code. Note that what phrase is formed can be designated by the user and can also be specified automatically by managing the relation between the preceding word and the subsequent word for each meaning.

Returning to FIG. 2, the conversion unit 22 is a processing unit that converts the compressed file coded by the coding unit 21 into an NNC. At the specific station, the conversion unit 22 specifies the NNC corresponding to each compression code contained in the compressed file in accordance with the NNC table 16 and converts each compression code into the applicable NNC. For example, the conversion unit 22 replaces each variable-length compression code in the compressed file with the fixed-length NNC.

Here, for a word to which the dynamic code is allocated, a method of converting the dynamic code to the NNC will be specifically described using a basic form conversion table that indicates an association between the static code of the basic form of the word and the NNC. For example, in regard to the polysemous word "cool", an association between the static code and the NNC of "cool (1)" meaning "cold", which is the basic form, will be described, and a method of converting the dynamic code of "cool (5)" meaning "smart" into an NNC will be described. Note that the polysemous word and the phrase are associated with NNCs in a one-to-N basis in advance.

Figure 7B:
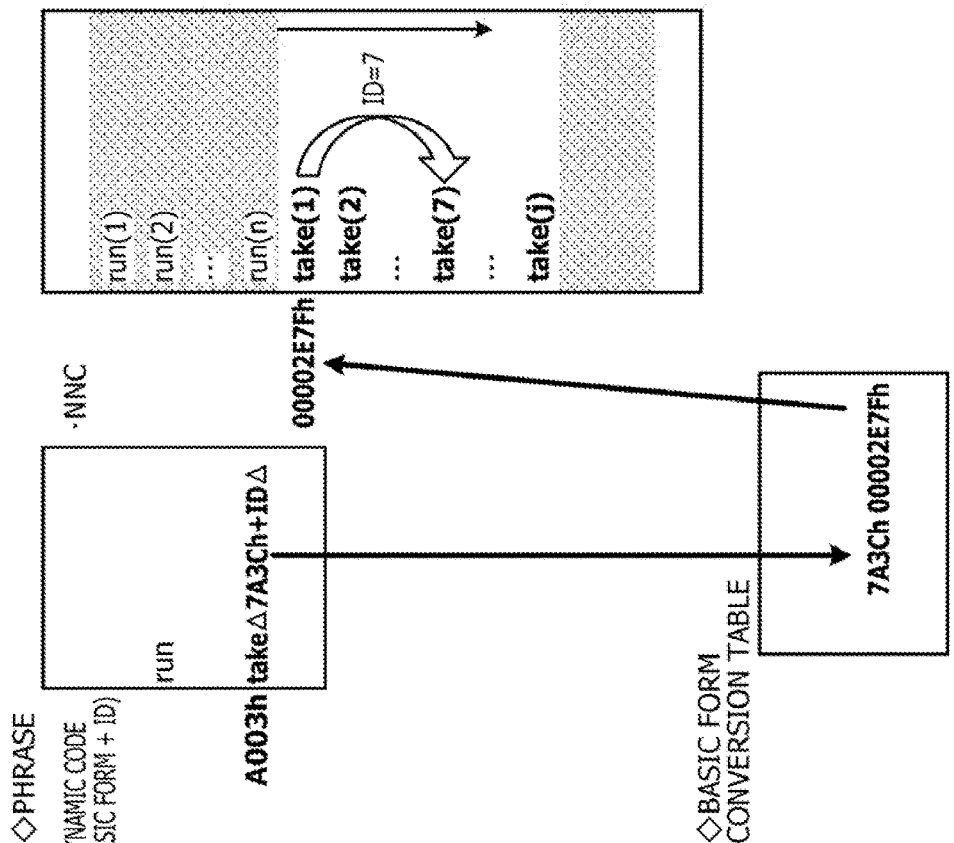
FIGS. 7A and 7B illustrate a diagram explaining the generation of NNCs from dynamic codes of a polysemous word and a phrase.
Figure 7A:
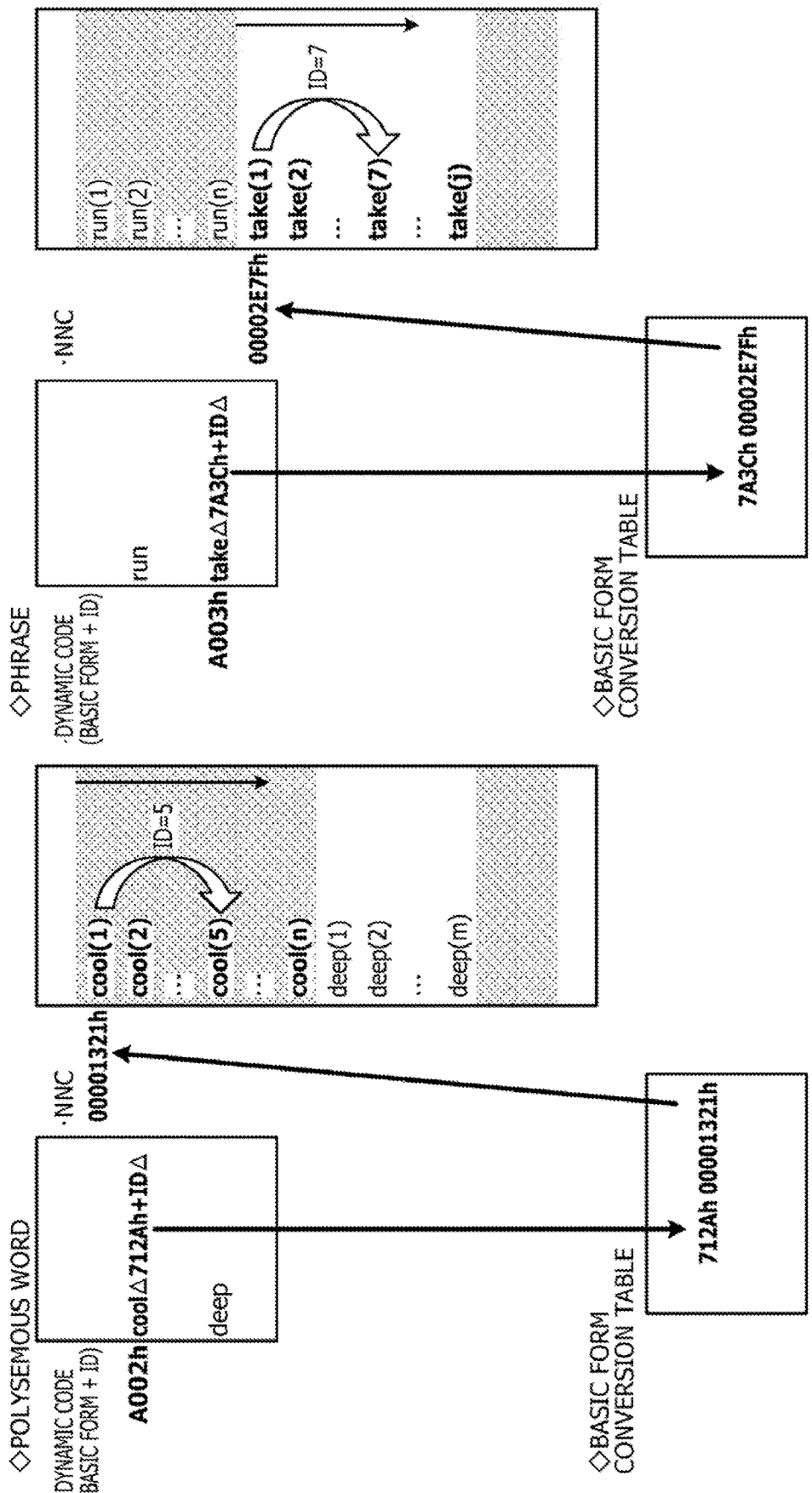

FIG. 7 (i.e., FIGS. 7A and 7B) is a diagram explaining the generation of NNCs from the dynamic codes of a polysemous word and a phrase using the basic form conversion table. FIG. 7A illustrates an example of a polysemous word, and FIG. 7B illustrates an example of a phrase. For the polysemous word, the conversion unit 22 stores the basic form of the word and a word meaning ID that specifies a meaning of the word in the dynamic dictionary in the compressed file.

Specifically, as illustrated in FIG. 7A, the conversion unit 22 stores the static code "712Ah" of the word "cool" and the position "00001321h" of the NNC in the basic form conversion table in association with each other. Using this basic form conversion table, the conversion unit 22 retrieves "00001321h" from information "coolΔ712Ah+ID" in a buffer of the dynamic code "A002h" of "cool (5)" that has the meaning of "smart" and adds 5, which is the ID, to generate an NNC. In addition, as illustrated in FIG. 7B, the static code "7A3Ch" of the word "take" and the position "00002E7Fh" of the NNC are stored in the basic form conversion table in association with each other. Using this basic form conversion table, the conversion unit 22 retrieves "00002E7Fh" from information "takeΔ7A3Ch+ID" in a buffer of the dynamic code "A003h" of the phrase "take (7)" and adds 7, which is the ID, to generate an NNC.

Figure 8A:
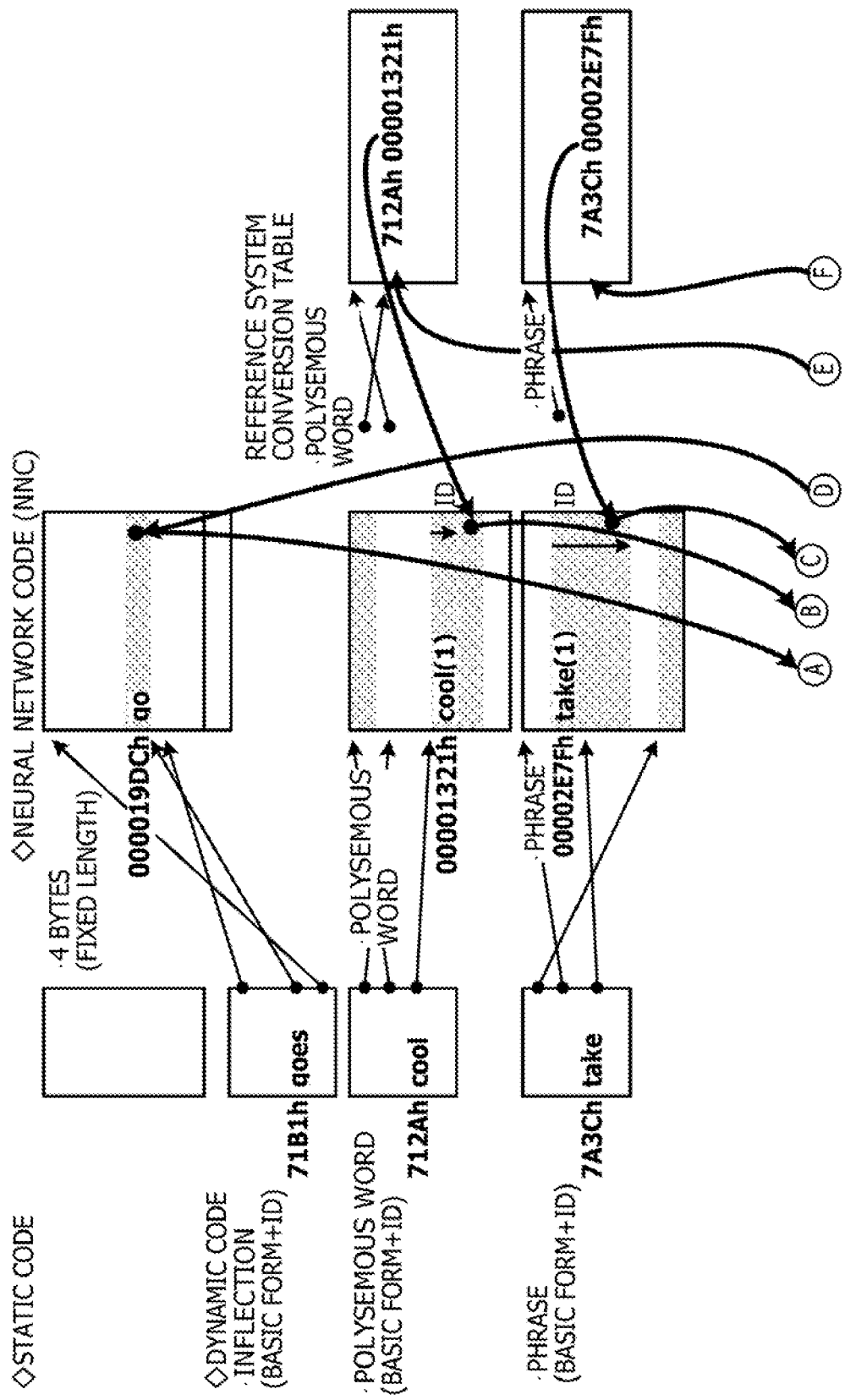
FIGS. 8A and 8B illustrate a diagram explaining the generation of an NNC from the dynamic code of an inflection.
Figure 8B:
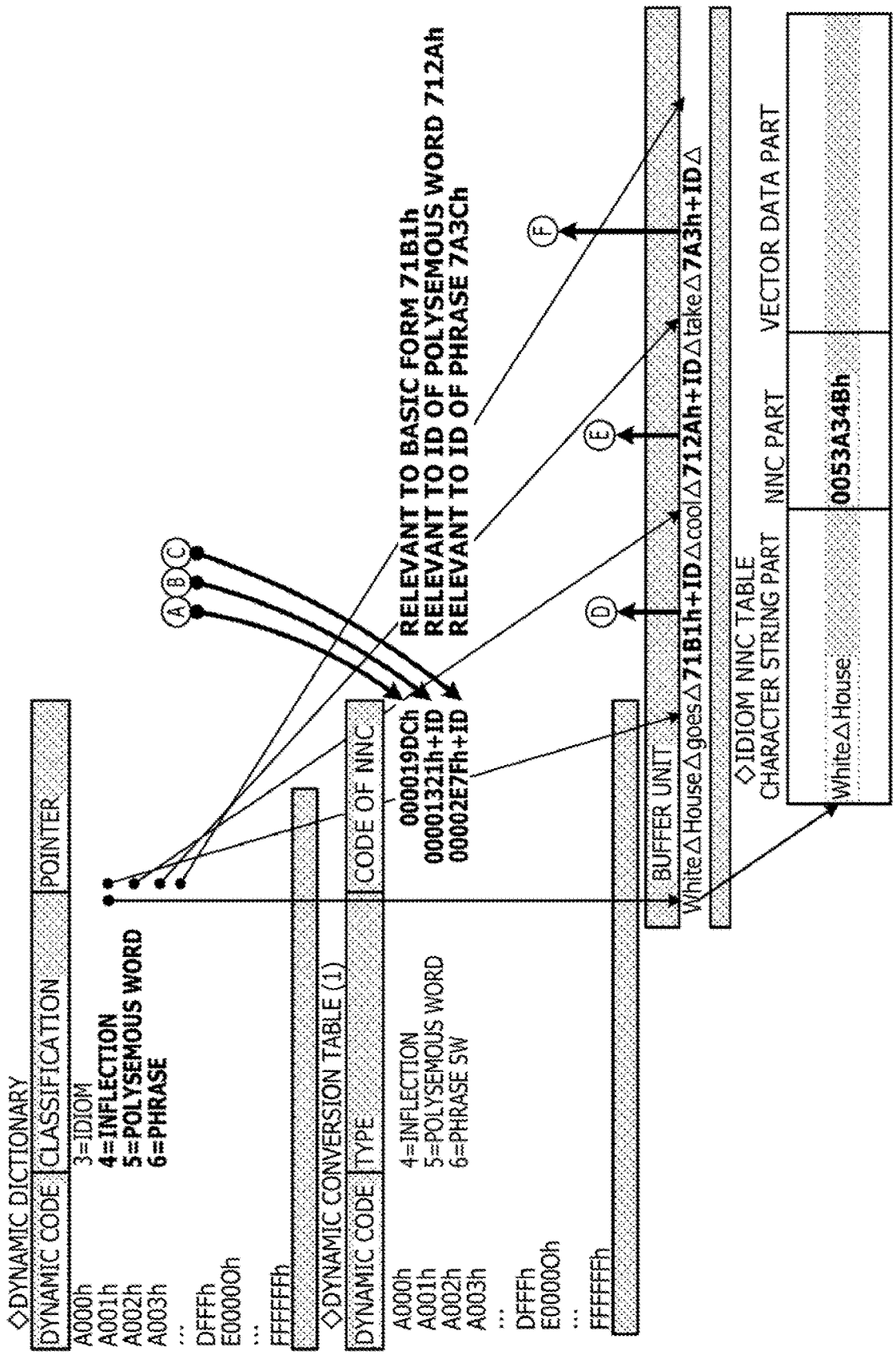

FIG. 8 (i.e., FIGS. 8A and 8B) is a diagram explaining the generation of NNCs from the dynamic codes of an inflection and an idiom. The conversion unit 22 generates an NNC from the dynamic code of an inflection in addition to the polysemous word and the phrase. Specifically, as illustrated in FIG. 8, the conversion unit 22 retrieves "000019CDh" from information "goΔ71B1h+ID" in a buffer of the dynamic code "71B1h" of inflected "goes" using the basic form conversion table (no need to add the ID) and generates an NNC.

Note that the idiom and the NNC table are associated with each other on a one-to-one basis, and the NNC can be retrieved on the basis of the character string of information in the buffer of the dynamic code. Specifically, for the idiom "White House", the conversion unit 22 compares the character string of information "WhiteΔHouse" in a buffer of the dynamic code "A000h" with the character string part of the NNC table and retrieves the NNC "0053A34Bh".

Returning to FIG. 2, the vectorization unit 23 is a processing unit that converts the NNC converted by the conversion unit 22 into a vector value. Specifically, the vectorization unit 23 allocates the vector value in advance for the static NNC associated with the static code and manages the allocated vector value in the vector table 17. In addition, as for the dynamic code, the vectorization unit 23 dynamically allocates the vector value when an NNC is assigned and given to the dynamic code and manages the allocated vector value in the vector table 17.

Then, the vectorization unit 23 dynamically manages the compression code (the static code or the dynamic code), the NNC, and the vector value in association with each other by executing the allocation of the vector value for each piece of the text data 13 after the NNC allocation is executed. As a result, the vectorization unit 23 converts each NNC converted from respective pieces of the text data 13 into a vector value by referring to the vector table 17 and generates vector data to output the generated vector data to the learning unit 24.

The learning unit 24 is a processing unit that executes machine learning using the vector data generated from the text data 13. Specifically, the learning unit 24 inputs the vector data to a recurrent neural network (RNN) and learns various parameters and the like of the RNN such that an error between the output from the RNN and a label (Japanese translation), which is correct answer information, becomes smaller. Then, when the learning is completed, the learning unit 24 stores the learning result including each parameter in the storage unit 12.

Figure 9:
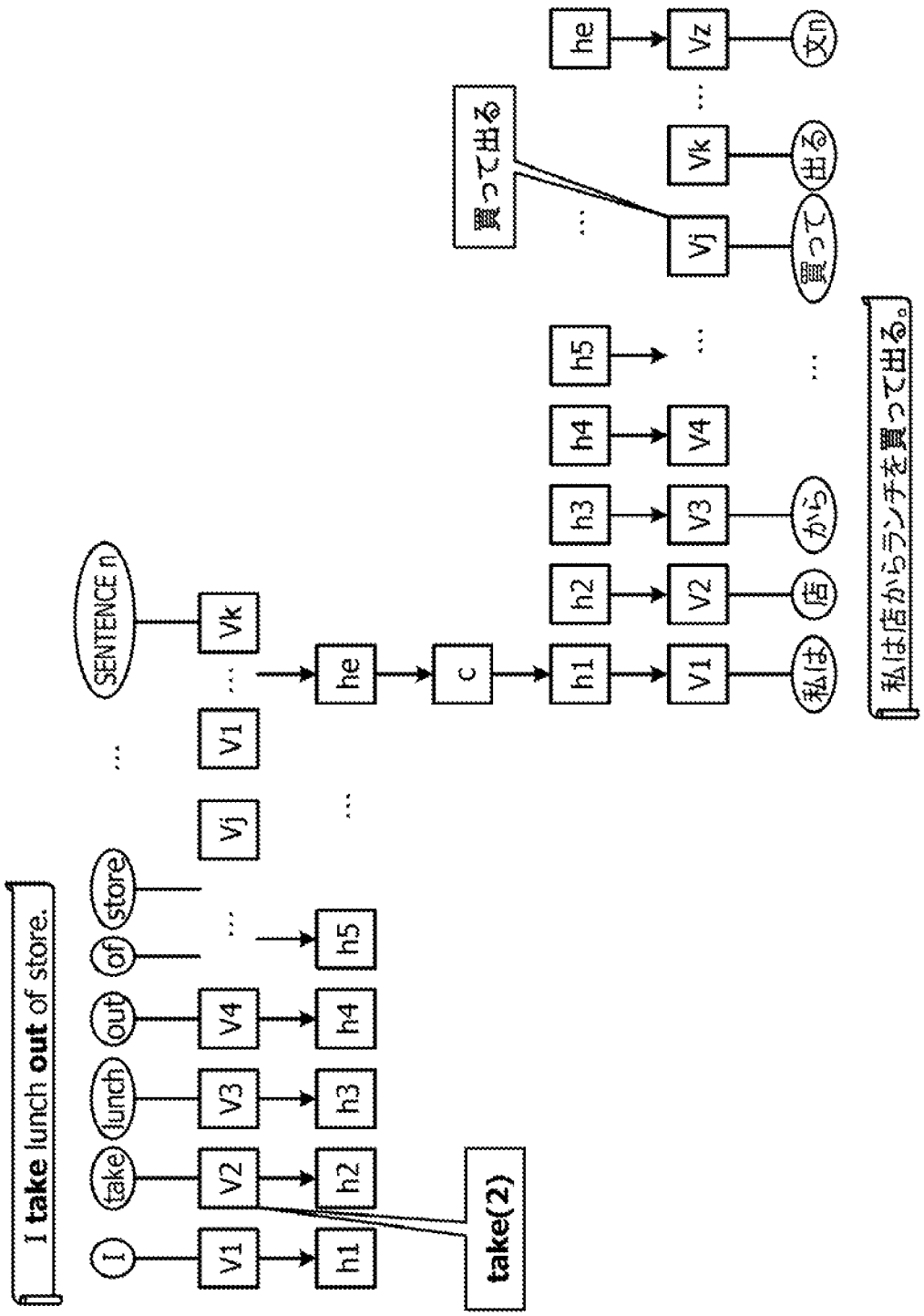
FIG. 9 is a diagram explaining a learning example of the first embodiment.

FIG. 9 is a diagram explaining a learning example of the first embodiment. In FIG. 9, an example will be described in which the input data "I take lunch out of store." and the output data "I buy lunch and go out of the store" are used as the teacher data. As illustrated in FIG. 9, the learning unit 24 inputs the vector data "V1, V2, . . . , Vn" generated from the text data "I take lunch out of store." by undergoing the compression coding and NNC transformation, to each input layer of the RNN.

Then, the learning unit 24 acquires the output result from an output layer of the RNN. Subsequently, the learning unit 24 refers to the static dictionary 14 and the dynamic dictionary 15 and the like to decode each output result and acquire the word, thereby acquiring the translation result. Thereafter, the learning unit 24 learns the RNN such that an error between the label "I buy lunch and go out of the store", which is an exact translation of the text data, and the translation result of the RNN becomes smaller.

Note that, after the learning is completed, when text data to be translated is input, the information processing device 10 executes the compression coding, NNC transformation, and vectorization to generate vector data and inputs the generated vector data to the learned RNN, similarly to when learning is performed. Then, the information processing device 10 outputs the output result of the learned RNN to the user as a translation result.

[Flow of Processing]

Figure 10A:
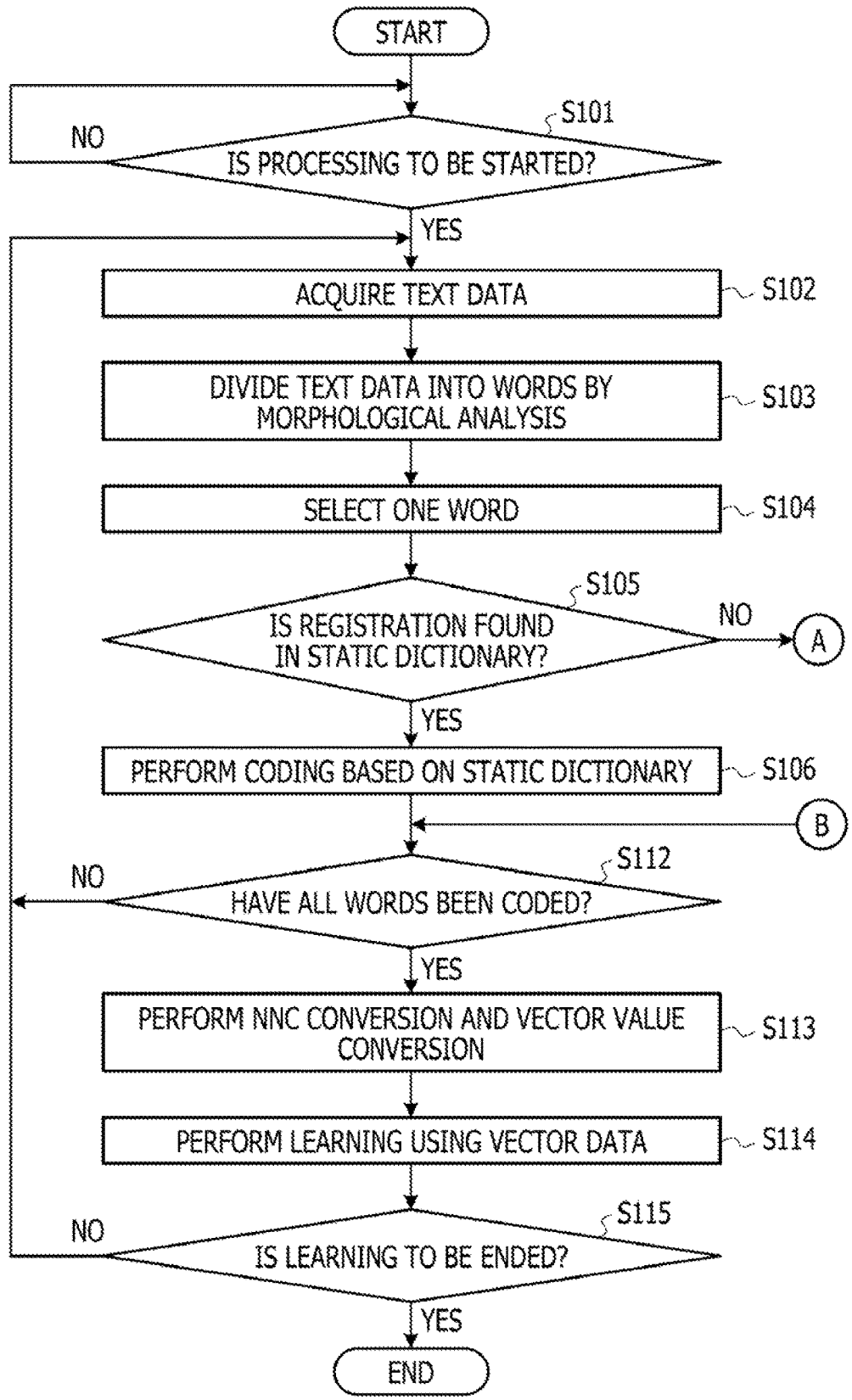
FIGS. 10A and 10B illustrate a flowchart illustrating a flow of processing.
Figure 10B:
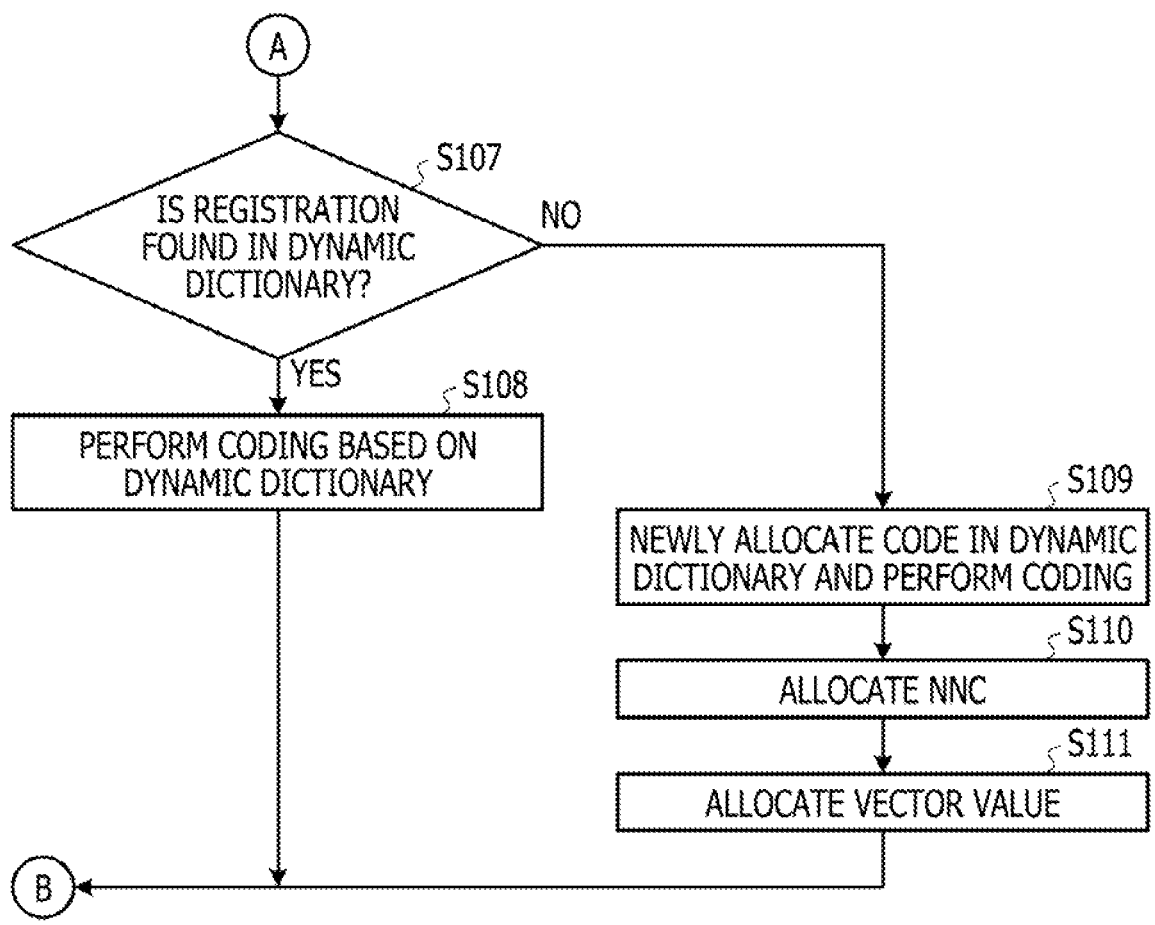

FIG. 10 (i.e., FIGS. 10A and 10B) is a flowchart illustrating a flow of processing. As illustrated in FIG. 10, when instructed to start the processing (S101: Yes), the coding unit 21 acquires the text data 13 from the storage unit 12 (S102) and divides the acquired text data 13 into words by morphological analysis or the like (S103).

Subsequently, the coding unit 21 selects one word (S104) and determines whether or not the selected word has been registered in the static dictionary 14 (S105). Here, when the registration is found in the static dictionary 14 (S105: Yes), the coding unit 21 performs coding based on the static dictionary 14 (S106). Note that, when the registration is found in the static dictionary, the association with the NNC table 16 and the vector table 17 has also been completed.

On the other hand, when the registration is not found in the static dictionary 14 (S105: No), the coding unit 21 determines whether or not the registration is found in the dynamic dictionary 15 (S107). Here, when the registration is found in the dynamic dictionary 15 (S107: Yes), the coding unit 21 performs coding based on the dynamic dictionary 15 (S108). Note that, when the registration is found in the dynamic dictionary, the association with the NNC table 16 and the vector table 17 has also been completed.

On the other hand, when the registration is not found in the dynamic dictionary 15 (S107: No), the coding unit 21 newly allocates a code in the dynamic dictionary 15 and codes the word (S109). Subsequently, the conversion unit 22 newly allocates an NNC to the allocated code (dynamic code) (S110). Furthermore, the vectorization unit 23 newly allocates a vector value to the newly allocated NNC (S111).

Thereafter, when the text data contains an unprocessed word (S112: No), S102 and the subsequent steps are repeated. On the other hand, when the processing is completed for all the words in the text data (S112: Yes), S113 and the subsequent steps are executed.

Specifically, the conversion unit 22 converts each compression code in the compressed file in which the text data 13 is coded into an NNC in accordance with the NNC table 16, and the vectorization unit 23 converts each NNC into a vector value in accordance with the vector table 17 (S113).

Subsequently, the learning unit 24 executes machine learning of the translation model using the vector data generated from the text data 13 (S114). Thereafter, when the learning is continued (S115: No), S102 and the subsequent steps are repeated, and when it is the timing to end the learning (S115: Yes), the learning is ended.

[Effects]

As described above, the information processing device 10 associates the word vector table 17 with the NNC as a 4-byte fixed-length code. In addition, the information processing device 10 generates a dynamic code conversion table from the dynamic dictionary of variable-length compression codes and converts the code into the NNC. Then, the information processing device 10 works out a 200-dimensional vector value of each word using the CBOW function or the like and stores the worked-out vector value in the word vector table 17.

Next, in the RNN machine learning, the information processing device 10 reads the compressed file to convert the code from the variable-length compression code into the fixed-length NNC and acquires the 200-dimensional vector value from the word vector table 17 associated with the code of NNC. Thereafter, the information processing device 10 performs brute-force calculation for each word and performs the RNN machine learning.

Figure 11:
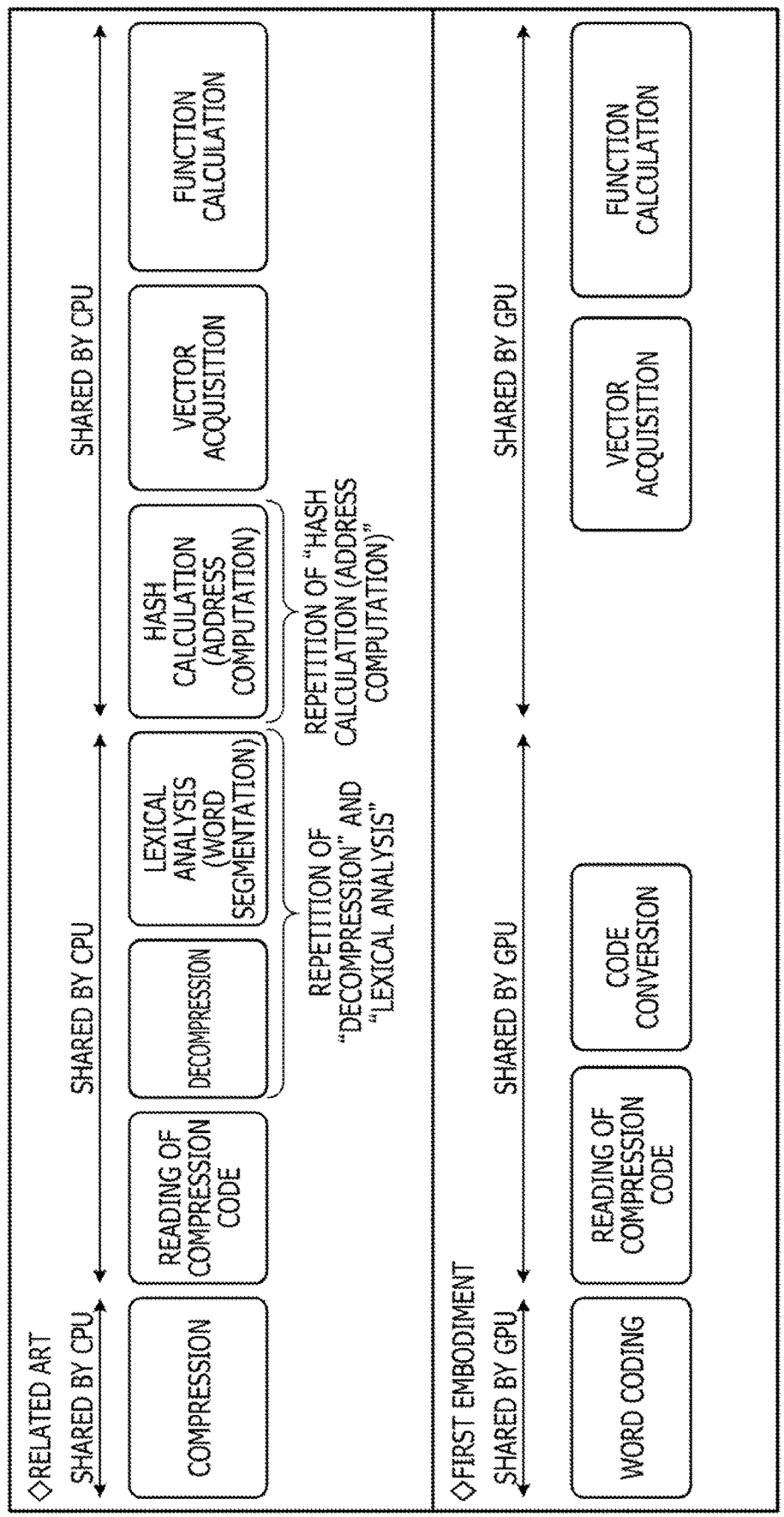
FIG. 11 is a diagram explaining speeding up of processing.

FIG. 11 is a diagram explaining speeding up of processing. As illustrated in FIG. 11, in the case of a commonly used related technique, the CPU executes compression for coding, reading of the compression code, decompression of the compression code, and lexical analysis (morphological analysis), and the GPU executes hash calculation, vector acquisition, and function calculation thereafter. In this case, when learning is performed using each piece of text data, the decompression and the lexical analysis are supposed to be repeated by the number of codes, and additionally the hash calculation is also supposed to be repeated by the number of codes, which makes the processing time longer.

On the other hand, in the case of the first embodiment, the CPU executes word coding and reading of the compression code, and vector acquisition and function calculation are shared by the GPU. As described above, since coding is performed in units of words and the compression code, the NNC, and the vector value are managed in association with each other, the repetition of decompression, lexical analysis, address calculation by a hash function, and the like, which has been performed in related techniques, may be reduced, and a significant speedup may be achieved.

Second Embodiment

Incidentally, in the first embodiment, an example using text data has been described, but the approach according to the first embodiment can also be applied to the base sequence of the genome. Thus, in a second embodiment, an example applied to the base sequence of the genome will be described.

Figure 12:
FIG. 12 is a diagram explaining a disadvantage when related art is applied to a base sequence.

FIG. 12 is a diagram explaining a disadvantage when a conventional technique is applied to the base sequence. As illustrated in FIG. 12, in a conventional compression technique, since a code is allocated to the longest matching character string of the input data, even if a meaning is established in units of codons such as CUG, ACU, or GAU as an amino acid, coding may not be performed in units of codons, and a coding split occurs in the middle of the codon. In this case, the accuracy of machine learning deteriorates because coding may not be performed in meaningful units of codons.

Thus, in the second embodiment, morphological analysis is performed in meaningful units such as proteins and amino acids, for example, and coding, NNC transformation, and vectorization are executed. Here, an example of learning clinical trial data containing proteins, amino acids, and the like as input data will be described as an example. Note that it is assumed that side effects are set as labels in the clinical trial data. That is, a machine learning model that predicts the occurrence and intensity of side effects is constructed using combinations of proteins and the like as feature amounts.

Figure 13A:
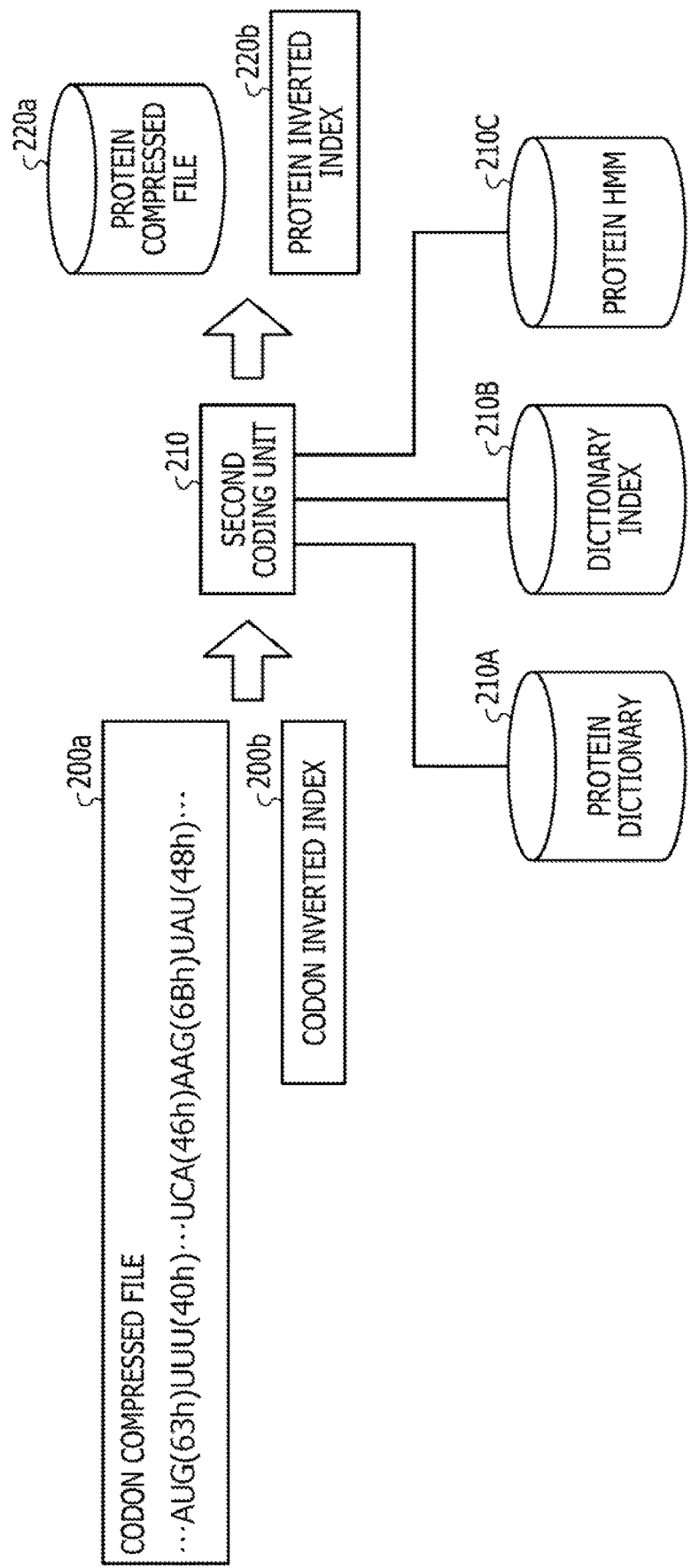
FIG. 13A is a diagram for explaining a process of specifying a protein contained in a genome.

FIG. 13A is a diagram for explaining a process of specifying a basic structure of protein contained in a genome. Hereafter, the basic structure of protein may be referred to as "protein". As illustrated in FIG. 13A, a second coding unit 210 generates a protein compressed file 220*a* and a protein inverted index 220*b* on the basis of a codon compressed file 200*a*, a codon inverted index 200*b*, a protein dictionary 210A, a dictionary index 210B, and a protein hidden Markov model (HMM) 210C.

The second coding unit 210 specifies a break in the codon code sequence of each protein contained in the codon compressed file 200a on the basis of the dictionary index 210B. The second coding unit 210 specifies the code of a protein corresponding to the codon code sequence between the respective breaks on the basis of the codon code sequence between the respective breaks and the protein dictionary 210A and converts the codon code sequence into the code of the protein.

When the codon code sequence following the code (break) of the protein is relevant to a plurality of codes of proteins, the second coding unit 210 specifies the code of a protein with the highest co-occurrence rate among the relevant plurality of codes of proteins, on the basis of the protein HMM 210C. The second coding unit 210 converts the codon code sequence following the break into the specified code of the protein. The second coding unit 210 generates the protein compressed file 220a by repeatedly executing the above process.

As mentioned above, the protein HMM 210C is generated by working out the co-occurrence rate between a protein contained in the codon compressed file 200a and a protein following this protein. By using the protein HMM 210C, the codon code sequence in the codon compressed file 200a can be cut out in correct units of proteins. By cutting out in correct units of proteins, the protein compressed file 220a in which the codon compressed file 200a is coded in units of proteins may be generated. In addition, since the sequence of the protein contained in the codon compressed file 200a can be specified, the protein may be easily specified.

Figure 13B:
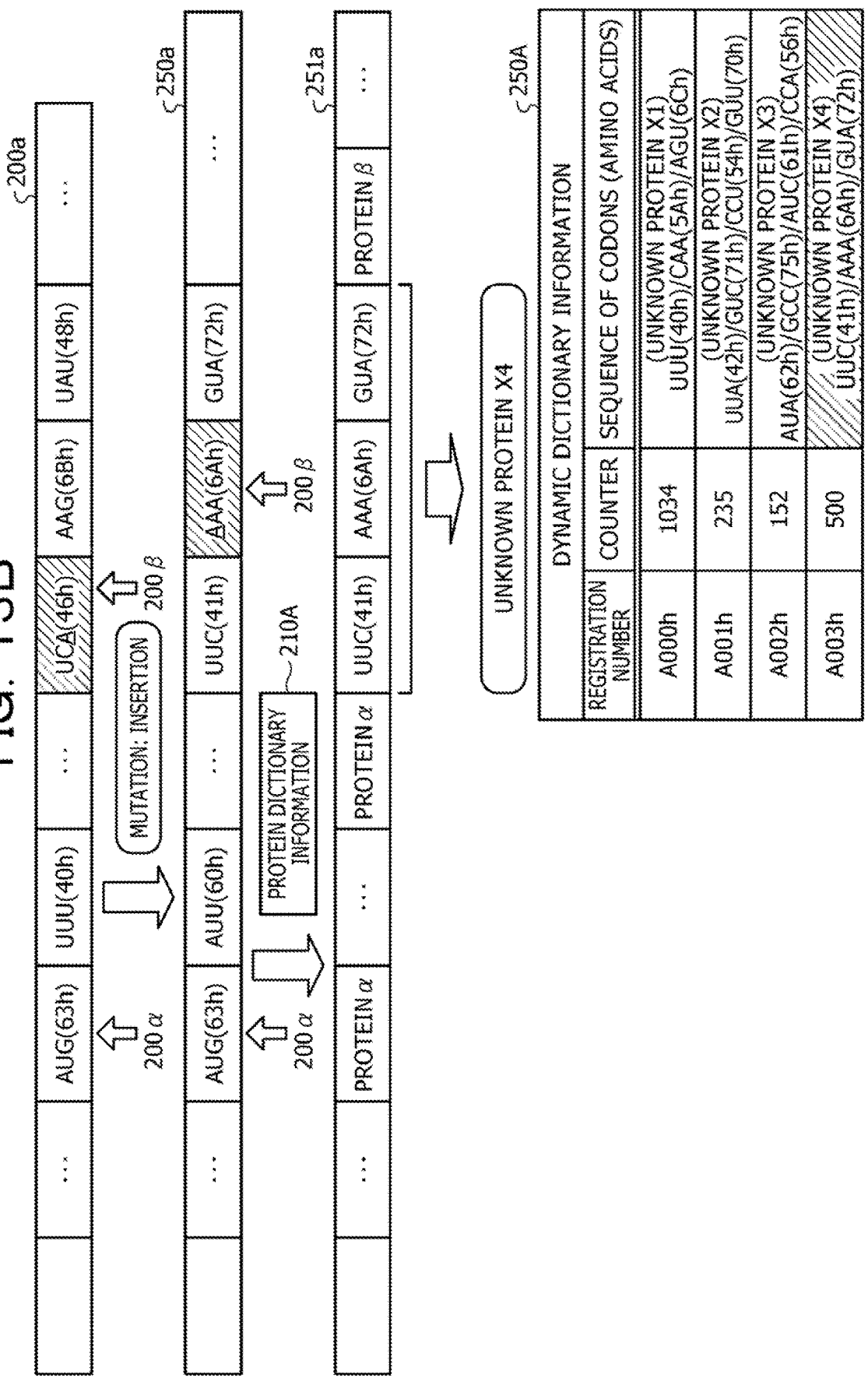
FIG. 13B is a diagram explaining an example of speeding up the evaluation of base sequence data in which mutation has occurred.

FIG. 13B is a diagram explaining an example of speeding up the evaluation of base sequence data in which mutation has occurred. As illustrated in FIG. 13B, an information processing device 10 generates new mutation genome data 250a by causing a mutation "insertion" in evaluation target genome data 200a to be evaluated. The information processing device 10 specifies a reference codon "AAA (6Ah)" of the mutation genome data 250a on the basis of a reference position 200B.

The information processing device 10 executes morphological analysis on the mutation genome data 250a in units of proteins so as to specify a plurality of morphemes contained in the mutation genome data 250a. For example, one morpheme contains a codon sequence corresponding to a protein.

The information processing device 10 compares the result of the morphological analysis executed on the mutation genome data 250a with protein dictionary information, which is information on a static dictionary that associates the code of a predetermined protein (existing protein) with the sequence of the codes in units of codons, and when a morpheme in the mutation genome data 250a gives a hit with a codon sequence in the protein dictionary information, converts the morpheme in the mutation genome data 250a into the code of the protein. In the present embodiment, the coded proteins are appropriately expressed by Greek letters such as proteins α, β, and γ.

In a case where the codon sequence of the morpheme including the reference codon does not give a hit with a codon sequence in the protein dictionary information, the information processing device 10 determines whether or not the codon sequence of the morpheme including the reference codon gives a hit with a codon sequence in dynamic dictionary information 250A. In a case where the codon sequence of the morpheme including the reference codon does not give a hit with a codon sequence in the dynamic dictionary information 250A, the information processing device determines that a cancer genome similar to the mutation genome data 250a does not exist in a cancer genome DB.

In contrast to this, in a case where the codon sequence of the morpheme including the reference codon gives a hit with a codon sequence in the dynamic dictionary information 250A, the information processing device 10 determines that a cancer genome similar to the mutation genome data 250a exists in the cancer genome DB. For example, since the codon sequence "UUC (41 h)/AAA (6Ah)/GUA (72 h)" including the reference codon "AAA (6 Ah)" exists in the dynamic dictionary information 250A, the information processing device determines that a cancer genome similar to the mutation genome data 250a exists in the cancer genome DB.

In a case where the codon sequence of the morpheme including the reference codon gives a hit with a codon sequence in the dynamic dictionary information 250A, the information processing device 10 codes the codon sequence according to a registration number. By executing the above process, the information processing device 10 generates mutation genome data 251a coded in units of proteins. In the following description, an unknown protein including the reference codon coded into a dynamic code in order to evaluate the similarity is referred to as a "reference protein" for convenience.

Figure 13C:
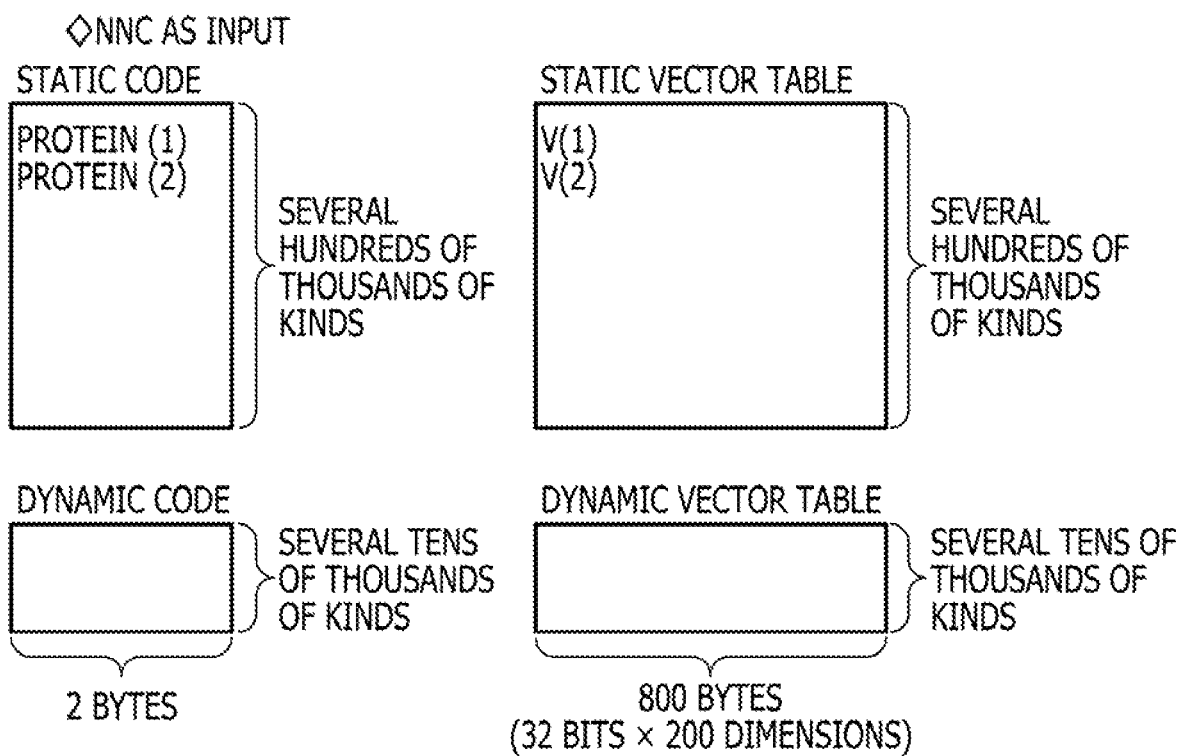
FIG. 13C is a diagram explaining processing according to a second embodiment.

FIG. 13C is a diagram explaining processing according to the second embodiment. As illustrated in FIG. 13C, the information processing device 10 according to the second embodiment allocates the static code or the dynamic code to each protein by the approach according to the first embodiment and updates the static dictionary 14 and the dynamic dictionary 15.

Then, the information processing device 10 allocates the NNC to the code allocated to each protein by the approach according to the first embodiment. For example, the information processing device 10 allocates an NNC (1) to the code allocated to a protein (1) and an NNC (2) to the code allocated to a protein (2) to generate the NNC table 16.

In addition, the information processing device 10 allocates the vector value to each NNC by the approach according to the first embodiment.

For example, the information processing device 10 allocates V (1) to the NNC (1) of the protein (1) and V (2) to the NNC (2) of the protein (2) to generate the vector table 17.

In this manner, when accepting clinical trial data containing proteins, amino acids, and the like, the information processing device 10 executes coding in accordance with the static dictionary 14 and the dynamic dictionary 15, NNC transformation in accordance with the NNC table 16, and vectorization of the clinical trial data in accordance with the vector table 17. Thereafter, the information processing device 10 inputs the vectorized vector data into the RNN and executes learning.

Figure 14:
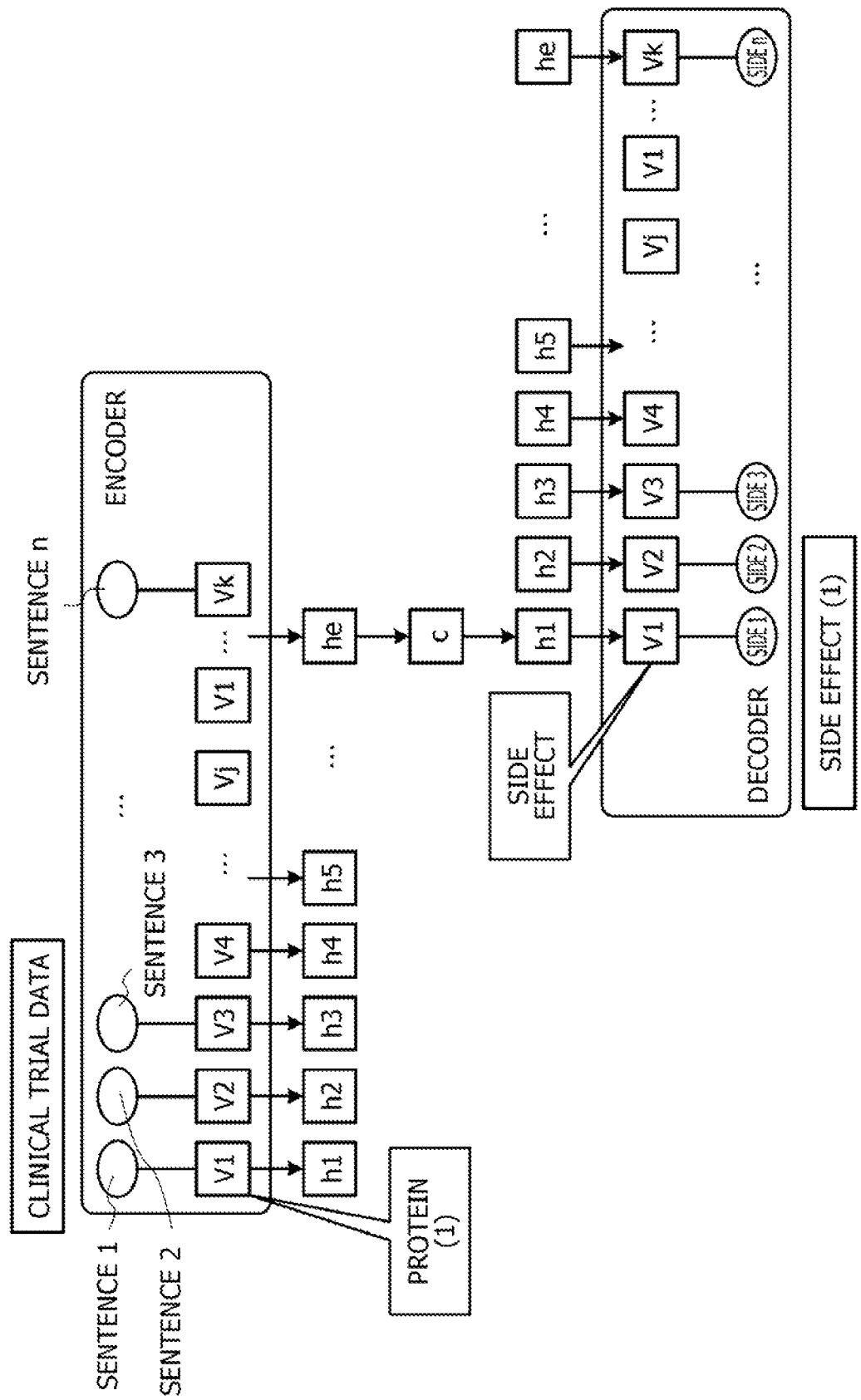
FIG. 14 is a diagram explaining a learning example of the second embodiment.

FIG. 14 is a diagram explaining a learning example of the second embodiment. In FIG. 14, an example in which the input data "clinical trial data" and the output data "side effects" are used as teacher data will be described. As illustrated in FIG. 14, after dividing the input data "clinical trial data" into meaningful units, the information processing device 10 executes compression coding and NNC transformation and generates vector data "V1, V2, . . . , Vn" to input the generated vector data to each input layer of the RNN.

Then, the information processing device 10 acquires the output result from an output layer of the RNN. Subsequently, the information processing device 10 refers to the static dictionary 14 and the dynamic dictionary 15 and the like to decode each output result and acquire the word, thereby acquiring the translation result. Thereafter, the learning unit 24 learns the RNN such that an error between the "side effects" set in the input data and the translation result of the RNN becomes smaller.

In the above manner, the information processing device 10 may perform learning by dividing the undelimited base sequence into meaningful units. As a result, the information processing device 10 may learn the relationship between the features of the base sequence and the side effects and may allow the learned relationship to be exploited for new drug development and the like.

Third Embodiment

Incidentally, the processing and the flows of processing in a general file system have been described for when the text data is input in the first embodiment above and additionally, for when the base sequence is input in the second embodiment above, but the processing and the flow of processing are not limited to these embodiments and can be applied to a database (DB).

Figure 15:
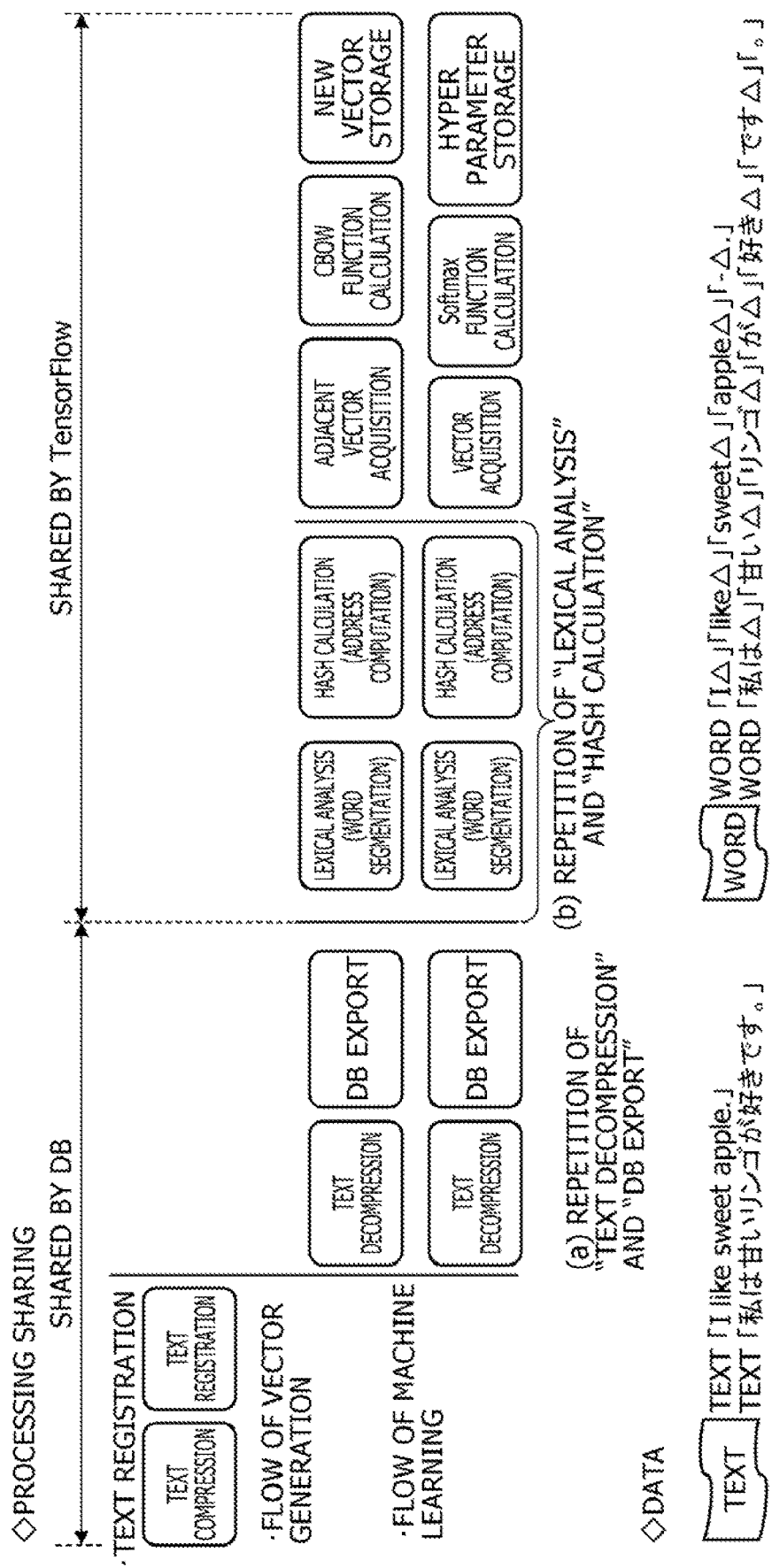
FIG. 15 is a diagram explaining a disadvantage when applied to a database.

FIG. 15 is a diagram explaining a disadvantage of a conventional database. As illustrated in FIG. 15, in a conventional technique, text is compressed and registered in the LZ78 system, but the text is decompressed and exported from the DB, and vector generation and machine learning are performed by TensorFlow or the like.

The vector generation and RNN machine learning are multidimensional analysis, can be processed in SQL language, and are originally suitable for the DB. Currently, in the field of numerical input such as weather prediction, they are also called In-Database analytics techniques, and applied techniques as artificial intelligence (AI) analytics have been widespread.

However, in AI analytics of text data, lexical analysis (morphological analysis) needs to be performed on words in meaningful units, and the actual situation is that the text data is exported from DB and subjected to analytics by TensorFlow or the like.

That is, in the conventional technique, it is supposed that text decompression and DB export illustrated in (a) of FIG. 15 are repeated, and lexical analysis and hash calculation illustrated in (b) of FIG. 15 are repeated for the text data. In the above manner, deterioration in accuracy due to polysemous words, phrases, and the like will be suppressed, but a delay in processing occurs. Thus, in the third embodiment, higher processing speed is implemented by omitting processes that are repeatedly performed in the conventional technique.

Figure 16:
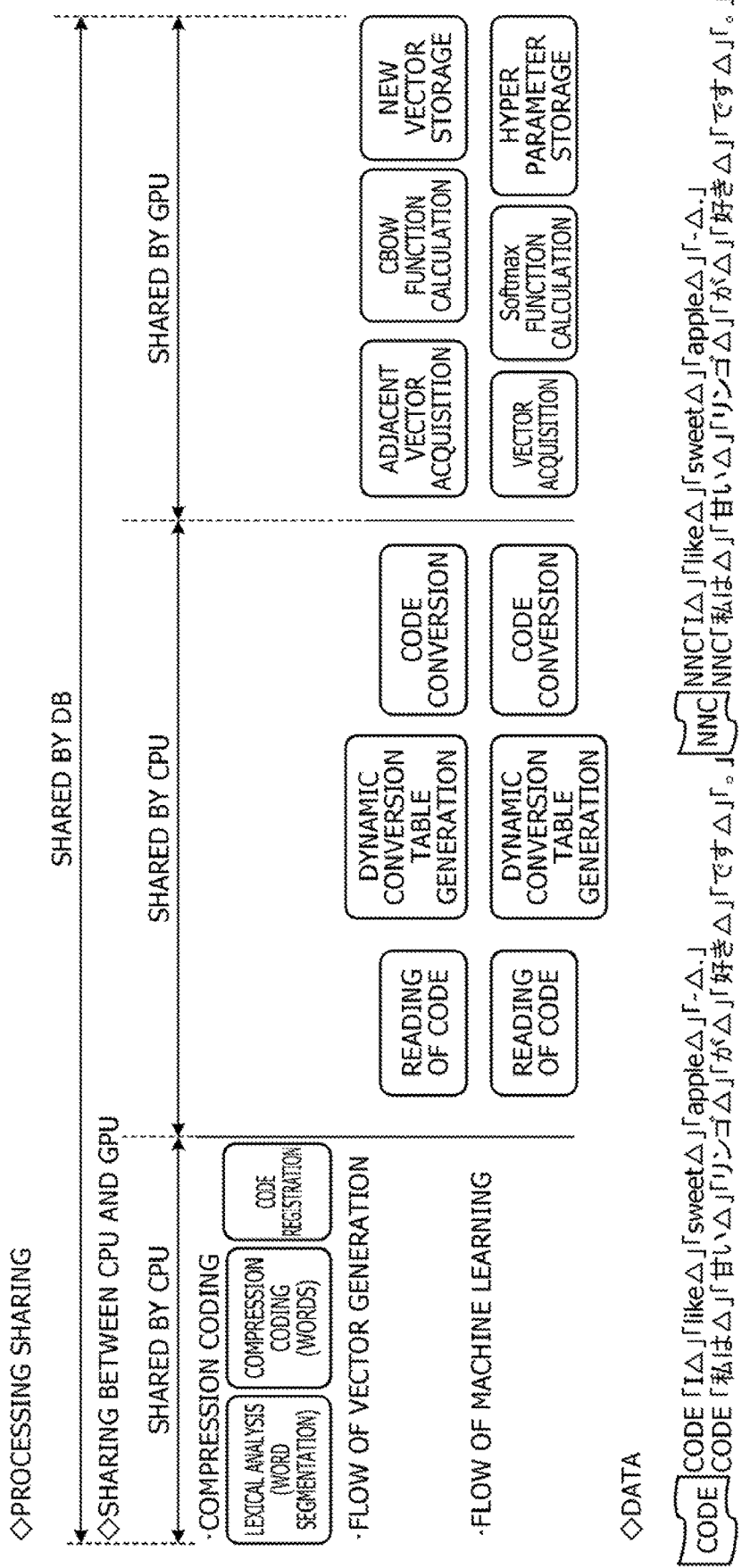
FIG. 16 is a diagram explaining an example of application to a database according to a third embodiment.

FIG. 16 is a diagram explaining an example of application to a database according to the third embodiment. As illustrated in FIG. 16, an information processing device 10 devises word coding, reviews the processes of text decompression and DB export, and utilizes the In-Database analytics technique to perform multidimensional analysis. Specifically, the information processing device 10 reads the compression code compressed in units of words to convert the read compression code into the NNC and executes the vector generation and RNN machine learning without extracting data from the database. In addition, in word compression, the information processing device 10 executes lexical analysis (morphological analysis), acquisition of the static code or dynamic code by hash calculation, coding, index generation, vector generation, and the like. Note that a similar approach to the approach in the first embodiment is used to associate the compression code of each word with the NNC and the vector data.

As described above, the information processing device 10 according to the third embodiment can omit the repetition of text decompression, DB export, lexical analysis, and hash calculation, which has been performed in the conventional technique, and accordingly may implement a higher processing speed.

Fourth Embodiment

Figure 17:
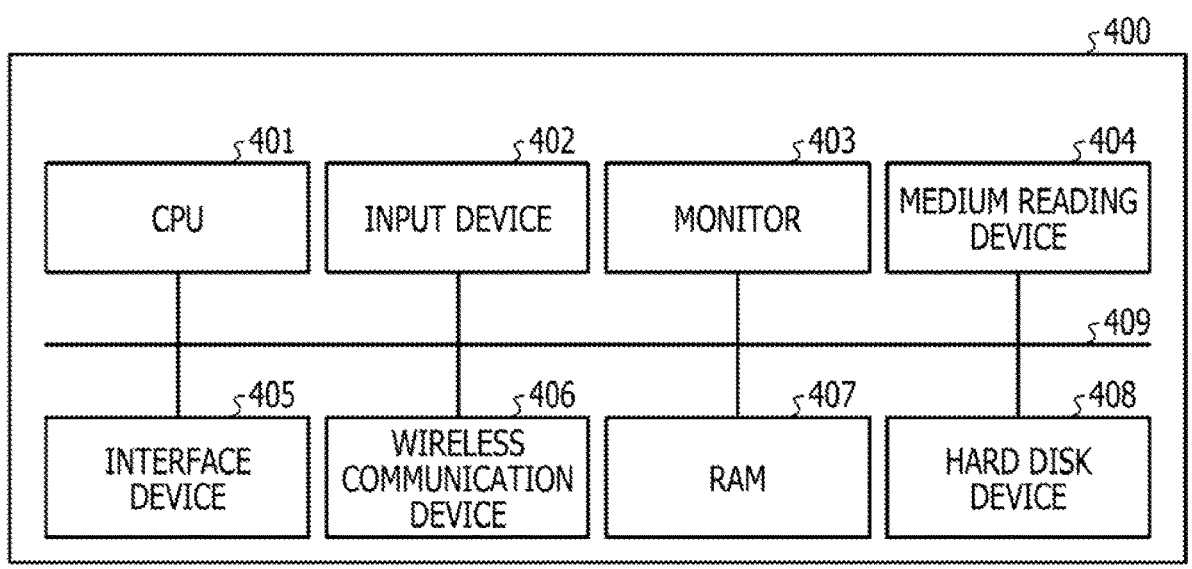
FIG. 17 is a diagram illustrating a hardware configuration of the information processing device.

While the embodiments of the present inventions have been described above, the present invention may be carried out in a variety of different modes in addition to the above-described embodiments. For example, for compression coding and the like, techniques of Japanese Laid-open Patent Publication No. 2018-195028 and the like can be adopted.
[Machine Learning Model]
The neural network machine learning model described above adopts machine learning to which the Softmax function is applied, but other machine learnings can also be used. In addition, learning can also be performed using functions of a restricted Boltzmann machine. Furthermore, although the explanation has been given using Japanese and English as an example, the languages are not limited, and other languages may be processed similarly.
[Various Associations]
In the above embodiments, an example of associating respective tables and the like using the basic form conversion table and the dynamic conversion table has been described, but the association is not limited to this example, and techniques such as address translation and pointers can also be used.
[Hardware Configuration]
FIG. 17 is a diagram illustrating a hardware configuration of the information processing device 10. As illustrated in the example in FIG. 17, a computer 400 includes a CPU 401 that executes various calculation processes, an input device 402 that accepts data input from a user, and a monitor 403. The computer 400 further includes a medium reading device 404 that reads a program and the like from a storage medium, an interface device 405 for connecting to another device, and a wireless communication device 406 for wirelessly connecting to another device. In addition, the computer 400 includes a random access memory (RAM) 407 that temporarily stores various sorts of information and a hard disk device 408. Furthermore, each of the devices 401 to 408 is connected to a bus 409.

The hard disk device 408 stores an information processing program that has a function similar to each of the processing units including the coding unit 21, the conversion unit 22, the vectorization unit 23, and the learning unit 24 illustrated in FIG. 2, for example. In addition, the hard disk device 408 stores various sorts of data for implementing the information processing program.

The CPU 401 reads out each program stored in the hard disk device 408 and develops and executes the readout program on the RAM 407 to perform various processes. These programs can make the computer 400 function as the coding unit 21, the conversion unit 22, the vectorization unit 23, and the learning unit 24 illustrated in FIG. 2, for example.

Note that the above-descried information processing program does not necessarily have to be stored in the hard disk device 408. For example, the program stored in a storage medium that is readable by the computer 400 may be read out and executed by the computer 400. For example, the storage medium that is readable by the computer 400 corresponds to a portable recording medium such as a compact disk read only memory (CD-ROM), a digital versatile disk (DVD), or a universal serial bus (USB) memory, a semiconductor memory such as a flash memory, a hard disk drive, or the like. In addition, this program may be stored in a device connected to a public line, the Internet, a local area network (LAN), or the like such that the computer 400 reads out and executes the program from this device.

[Program Configuration]

Figure 18:
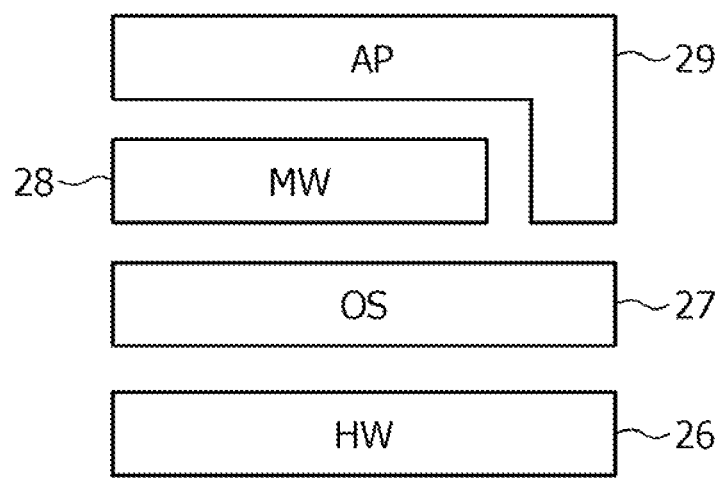
FIG. 18 is a diagram illustrating a configuration example of programs running on a computer.

FIG. 18 is a diagram illustrating a configuration example of programs running on the computer 400. In the computer 400, an operating system (OS) 27 that controls a hardware group 26 (401 to 409) illustrated in FIG. 17 runs. The CPU 401 runs using a procedure in accordance with the OS 27, and the hardware group 26 executes processes in accordance with an application program 29 and middleware 28 by controlling and managing the hardware group 26. Furthermore, in the computer 400, the middleware 28 or the application program 29 is read out into the RAM 407 and executed by the CPU 401.

When the compression function is called by the CPU 401, the function of a compression unit 110 is implemented by performing processes based on at least a part of the middleware 28 or the application program 29 (these processes by controlling the hardware group 26 based on the OS 27). The compression function may be included individually in the application program 29 directly or may be a part of the middleware 28 executed by being called in accordance with the application program 29.

The compressed file obtained by the compression function of the application program 29 (or the middleware 28) can also be partially decompressed. When the middle of the compressed file is decompressed, the load on the CPU 401 is suppressed because the decompression process for compressed data up to the part to be decompressed is suppressed. In addition, since the compressed data to be decompressed is partially developed on the RAM 407, the work area is also reduced.

[System]

Figure 19:
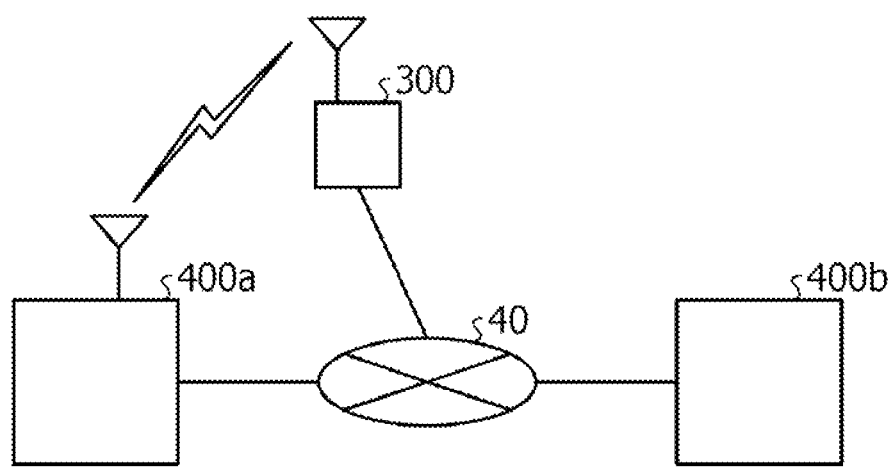
FIG. 19 is a diagram illustrating a configuration example of devices in a system of the embodiment.

FIG. 19 is a diagram illustrating a configuration example of devices in a system of the embodiment. The system in FIG. 19 includes a computer 400a, a computer 400b, a base station 300, and a network 40. The computer 400a is connected to the network 40 connected to the computer 400b in at least one of a wireless manner or a wired manner.

Pieces of information including a processing procedure, a control procedure, a specific name, various sorts of data, and parameters described above or illustrated in the drawings may be optionally changed unless otherwise noted.

In addition, each component of each device illustrated in the drawings is functionally conceptual and does not necessarily have to be physically configured as illustrated in the drawings. For example, specific forms of distribution and integration of each device are not limited to those illustrated in the drawings. That is, the whole or a part of the device may be configured by being functionally or physically distributed or integrated in optional units according to various loads, usage situations, or the like.

Moreover, all or any part of individual processing functions performed in each device may be implemented by a CPU and a program analyzed and executed by the CPU, or may be implemented as hardware by wired logic.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A control method implemented by a computer including a central processing unit, CPU, and a graphics processing unit, GPU, the method comprising:

by the CPU of the computer,
associating individual fixed-length codes with respective variable-length compression codes allocated to each word contained in text data, the text data is data generated in a first language and set with translated words that have been translated into a second language as correct answer information,
generating a dynamic code conversion table from a dynamic dictionary of the variable-length compression codes,
associating the individual fixed-length codes that correspond to the respective variable-length compression codes, with multi-dimensional vector values used for input to machine translation to which a neural network is applied, and
storing the multi-dimensional vector values in a word vector table; and by the GPU of the computer,
reading a compressed file to convert each of the variable-length compression codes included in the compressed file to associated fixed-length code of the fixed-length codes,
acquiring, for each fixed length code of the fixed-length codes converted from the variable-length compression codes included in the compressed file, the multi-dimensional vector value from the word vector table associated with the fixed-length code to generate vector data using the multi-dimensional vector value,
performing calculation for each word, and
performing machine learning including executing learning of a translation model that translates the text data into the second language by using the vector data as an explanatory variable and the correct answer information as an objective variable.

2. The control method according to claim 1, wherein a memory device of the computer stores:
a compression dictionary that associates the variable-length compression codes with each meaning of a polysemous word that has a plurality of meanings or each meaning of a phrase used in a plurality of idioms, and
each meaning of the polysemous word or each meaning of the phrase in association with the fixed-length codes, and
the control method further includes generating a conversion dictionary in which the variable-length compression codes that correspond to each meaning of the polysemous word or the variable-length compression codes that correspond to each meaning of the phrase are associated with the respective fixed-length codes stored in the memory device.

3. The control method according to claim 1, wherein a memory device of the computer stores:

a compression dictionary that associates the codes with a codon sequence of each morpheme that includes codons that form a protein and include a predefined reference codon, and the codon sequence of each morpheme in association with the fixed-length codes, and the control method further includes generating a conversion dictionary in which the variable-length compression codes that correspond to the codon sequence of each morpheme are associated with the respective fixed-length codes stored in the memory device.

4. The control method according to claim 1,
wherein the acquiring of the multi-dimensional vector value includes:
acquiring the word vector table in which the plurality of fixed-length codes are associated with multi-dimensional vector values;
specifying one of the variable-length compression codes that corresponds to data stored in a database without extracting the data from the database;
converting one of the fixed-length codes that corresponds to the specified one of the variable-length compression codes into one of the multi-dimensional vector values based on the word vector table list to generate the vector data; and
executing machine learning by using the vector data.

5. The control method according to claim 1,
wherein the acquiring of the multi-dimensional vector value includes:
acquiring the word vector table in which the plurality of fixed-length codes are associated with the multi-dimensional vector values;
converting the individual fixed-length codes that correspond to each of the variable-length compression codes contained in the compressed data into the multi-dimensional vector values based on the word vector table to generate vector data from the compressed data; and
executing machine learning by using the vector data.

6. The control method according to claim 5,
wherein the acquiring of the multi-dimensional vector value includes:
specifying the individual fixed-length codes that correspond to each of the variable-length compression codes contained in coded data in which each word obtained by performing morphological analysis on the text data is coded,
converting the individual fixed-length codes into the multi-dimensional vector values to generate the vector data from the compressed data, and
executing learning of a translation model that translates the text data into the second language by using the vector data as an explanatory variable and the correct answer information as an objective variable.

7. The control method according to claim 6, wherein the executing the machine learning includes executing learning of the translation model by using a function of a restricted Boltzmann machine.

8. A non-transitory computer-readable storage medium storing a control program comprising instructions which, when the program is executed by a computer including a central processing unit, CPU, and a graphics processing unit, GPU, cause the computer to perform processing, the processing comprising:
by the CPU of the computer,
associating individual fixed-length codes with respective variable-length compression codes allocated to each word contained in text data, the text data is data generated in a first language and set with translated words that have been translated into a second language as correct answer information,
generating a dynamic code conversion table from a dynamic dictionary of the variable-length compression codes,
associating the individual fixed-length codes that correspond to the respective variable-length compression codes, with multi-dimensional vector values used for input to machine translation to which a neural network is applied, and
storing the multi-dimensional vector values in a word vector table; and
by the GPU of the computer,
reading a compressed file to convert each of the variable-length compression codes included in the compressed file to associated fixed-length code of the fixed-length codes,
acquiring, for each fixed length code of the fixed-length codes converted from the variable-length compression codes included in the compressed file, the multi-dimensional vector value from the word vector table associated with the fixed-length code to generate vector data using the multi-dimensional vector value,
performing calculation for each word, and
performing machine learning including executing learning of a translation model that translates the text data into the second language by using the vector data as an explanatory variable and the correct answer information as an objective variable.

9. An information processing device comprising:
a memory;
a central processing unit, CPU, the CPU being configured to perform processing comprising:
associating individual fixed-length codes with respective variable-length compression codes allocated to each word contained in text data, the text data is data generated in a first language and set with translated words that have been translated into a second language as correct answer information,
generating a dynamic code conversion table from a dynamic dictionary of the variable-length compression codes,
associating the individual fixed-length codes that correspond to the respective variable-length compression codes, with multi-dimensional vector values used for input to machine translation to which a neural network is applied, and
storing the multi-dimensional vector values in a word vector table; and
a graphics processing unit, GPU, the GPU being configured to perform processing comprising:
reading a compressed file to convert each of the variable-length compression codes included in the compressed file to associated fixed-length code of the fixed-length codes,
acquiring, for each fixed length code of the fixed-length codes converted from the variable-length compression codes included in the compressed file, the multi-dimensional vector value from the word vector table associated with the fixed-length code to generate vector data using the multi-dimensional vector value,
performing calculation for each word, and
performing machine learning including executing learning of a translation model that translates the text data into the second language by using the vector data as an explanatory variable and the correct answer information as an objective variable.

* * * * *